United States Patent
Sandhu et al.

(10) Patent No.: US 10,347,689 B2
(45) Date of Patent: Jul. 9, 2019

(54) MAGNETIC DEVICES WITH MAGNETIC AND GETTER REGIONS AND METHODS OF FORMATION

(71) Applicant: Micron Technology, Inc., Boise, ID (US)

(72) Inventors: Gurtej S. Sandhu, Boise, ID (US); Sumeet C. Pandey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 181 days.

(21) Appl. No.: 15/660,417

(22) Filed: Jul. 26, 2017

(65) Prior Publication Data

US 2017/0323927 A1    Nov. 9, 2017

Related U.S. Application Data

(63) Continuation of application No. 15/162,119, filed on May 23, 2016, which is a continuation of application
(Continued)

(51) Int. Cl.
*H01L 43/10* (2006.01)
*H01L 27/22* (2006.01)
(Continued)

(52) U.S. Cl.
CPC ............ *H01L 27/222* (2013.01); *H01L 43/02* (2013.01); *H01L 43/08* (2013.01); *H01L 43/10* (2013.01); *H01L 43/12* (2013.01); *H01L 27/226* (2013.01)

(58) Field of Classification Search
CPC ....... H01L 43/10; H01L 43/02; H01L 27/222; H01L 43/12
See application file for complete search history.

(56) References Cited

U.S. PATENT DOCUMENTS 4,882,936 A    11/1989    Garshelis
5,551,586 A    9/1996    Uenoyama et al.
(Continued)

FOREIGN PATENT DOCUMENTS

CN    101162756 A    4/2008
CN    101395732 A    3/2009
(Continued)

OTHER PUBLICATIONS

Resnik et al., Mechanical Stress in Thin Film Microstructures on Silicon Substrate, Vacuum, vol. 80, (2005), pp. 236-240.
(Continued)

*Primary Examiner* — Cory W Eskridge
(74) *Attorney, Agent, or Firm* — TraskBritt

(57) ABSTRACT

A magnetic cell includes magnetic, secondary oxide, and getter seed regions. During formation, a diffusive species is transferred from a precursor magnetic material to the getter seed region, due to a chemical affinity elicited by a getter species. The depletion of the magnetic material enables crystallization of the depleted magnetic material through crystal structure propagation from a neighboring crystalline material, without interference from the now-enriched getter seed region. This promotes high tunnel magnetoresistance and high magnetic anisotropy strength. Also during formation, another diffusive species is transferred from a precursor oxide material to the getter seed region, due to a chemical affinity elicited by another getter species. The depletion of the oxide material enables lower electrical resistance and low damping in the cell structure. Methods of fabrication and semiconductor devices are also disclosed.

19 Claims, 11 Drawing Sheets

Related U.S. Application Data

No. 14/516,347, filed on Oct. 16, 2014, now Pat. No. 9,349,945.

(51) Int. Cl.
*H01L 43/02* (2006.01)
*H01L 43/12* (2006.01)
*H01L 43/08* (2006.01)

(56) References Cited

U.S. PATENT DOCUMENTS

| | | |
|---|---|---|
| 5,563,000 A | 10/1996 | Hatwar et al. |
| 5,565,266 A | 10/1996 | Hatwar et al. |
| 5,583,725 A | 12/1996 | Coffey et al. |
| 5,604,030 A | 2/1997 | Yamane et al. |
| 5,768,069 A | 6/1998 | Mauri |
| 6,166,948 A | 12/2000 | Parkin et al. |
| 6,258,470 B1 | 7/2001 | Sakakima et al. |
| 6,275,363 B1 | 8/2001 | Gill |
| 6,347,049 B1 | 2/2002 | Childress et al. |
| 6,363,000 B2 | 3/2002 | Perner et al. |
| 6,387,476 B1 | 5/2002 | Iwasaki et al. |
| 6,483,741 B1 | 11/2002 | Iwasaki et al. |
| 6,560,135 B2 | 5/2003 | Matsuoka et al. |
| 6,569,545 B1 | 5/2003 | Kanbe et al. |
| 6,611,405 B1 | 8/2003 | Inomata et al. |
| 6,653,704 B1 | 11/2003 | Gurney et al. |
| 6,703,249 B2 | 3/2004 | Okazawa et al. |
| 6,771,534 B2 | 8/2004 | Stipe |
| 6,806,096 B1 | 10/2004 | Kim et al. |
| 6,845,038 B1 | 1/2005 | Shukh |
| 6,955,857 B2 | 10/2005 | Kubota et al. |
| 6,964,819 B1 | 11/2005 | Girt et al. |
| 6,970,376 B1 | 11/2005 | Fukuzumi |
| 6,980,468 B1 | 12/2005 | Ounadjela |
| 6,992,359 B2 | 1/2006 | Nguyen et al. |
| 6,998,150 B2 | 2/2006 | Li et al. |
| 7,026,671 B2 | 4/2006 | Mizuguchi et al. |
| 7,095,933 B2 | 8/2006 | Barth |
| 7,130,167 B2 | 10/2006 | Gill |
| 7,189,583 B2 | 3/2007 | Drewes |
| 7,230,265 B2 | 6/2007 | Kaiser et al. |
| 7,239,489 B2 | 7/2007 | Lin et al. |
| 7,274,080 B1 | 9/2007 | Parkin |
| 7,372,674 B2 | 5/2008 | Gill |
| 7,378,698 B2 | 5/2008 | Ha et al. |
| 7,379,280 B2 | 5/2008 | Fukumoto et al. |
| 7,486,552 B2 | 2/2009 | Apalkov et al. |
| 7,488,609 B1 | 2/2009 | Lin et al. |
| 7,514,160 B2 | 4/2009 | Nagahama et al. |
| 7,563,486 B2 | 7/2009 | Barth |
| 7,564,152 B1 | 7/2009 | Clark et al. |
| 7,602,033 B2 | 10/2009 | Zhao et al. |
| 7,660,153 B2 | 2/2010 | Yamane et al. |
| 7,682,841 B2 | 3/2010 | Dahmani et al. |
| 7,732,881 B2 | 6/2010 | Wang |
| 7,750,421 B2 | 7/2010 | Horng et al. |
| 7,791,844 B2 | 9/2010 | Carey et al. |
| 7,835,173 B2 | 11/2010 | Ma et al. |
| 7,863,060 B2 | 1/2011 | Belen et al. |
| 7,885,105 B2 | 2/2011 | Li et al. |
| 7,919,794 B2 | 4/2011 | Gu et al. |
| 7,929,370 B2 | 4/2011 | Min |
| 7,932,572 B2 | 4/2011 | Tsujiuchi |
| 7,948,044 B2 | 5/2011 | Horng et al. |
| 8,009,465 B2 | 8/2011 | Nakayama et al. |
| 8,043,732 B2 | 10/2011 | Anderson et al. |
| 8,048,492 B2 | 11/2011 | Fukuzawa et al. |
| 8,068,317 B2 | 11/2011 | Gill |
| 8,080,432 B2 | 12/2011 | Horng et al. |
| 8,089,137 B2 | 1/2012 | Lung et al. |
| 8,102,700 B2 | 1/2012 | Liu et al. |
| 8,120,949 B2 | 2/2012 | Ranjan et al. |
| 8,138,561 B2 | 3/2012 | Horng et al. |
| 8,223,539 B2 | 7/2012 | Smythe et al. |
| 8,324,697 B2 | 12/2012 | Worledge |
| 8,334,148 B2 | 12/2012 | Jeong et al. |
| 8,338,004 B2 | 12/2012 | Shin et al. |
| 8,357,962 B2 | 1/2013 | Marukame et al. |
| 8,385,107 B2 | 2/2013 | Prejbeanu |
| 8,411,498 B2 | 4/2013 | Kim et al. |
| 8,422,286 B2 | 4/2013 | Ranjan et al. |
| 8,470,462 B2 | 6/2013 | Horng et al. |
| 8,487,390 B2 | 7/2013 | Dimitrov et al. |
| 8,492,169 B2 | 7/2013 | Cao et al. |
| 8,514,527 B2 | 8/2013 | Komagaki et al. |
| 8,545,999 B1 | 10/2013 | Leng et al. |
| 8,570,798 B2 | 10/2013 | Meade et al. |
| 8,587,043 B2 | 11/2013 | Natori et al. |
| 8,604,573 B2 | 12/2013 | Yamakawa et al. |
| 8,623,452 B2 | 1/2014 | Zhou |
| 8,692,342 B2 | 4/2014 | Oh et al. |
| 8,704,320 B2 | 4/2014 | Zhu et al. |
| 8,749,003 B2 | 6/2014 | Horng et al. |
| 8,766,341 B2 | 7/2014 | Han et al. |
| 8,779,538 B2 | 7/2014 | Chen et al. |
| 8,790,798 B2 | 7/2014 | Shukh |
| 8,803,265 B2 | 8/2014 | Lim et al. |
| 8,812,803 B2 | 8/2014 | Tsuchiya et al. |
| 8,823,118 B2 | 9/2014 | Horng et al. |
| 8,923,038 B2 | 12/2014 | Kula et al. |
| 9,269,888 B2 | 2/2016 | Meade et al. |
| 9,373,780 B2 | 6/2016 | Jan et al. |
| 9,466,789 B2 | 10/2016 | Wang et al. |
| 9,472,752 B2 | 10/2016 | Wang et al. |
| 9,705,075 B2 | 7/2017 | Lim et al. |
| 9,786,841 B2 | 10/2017 | Siddik et al. |
| 10,014,466 B2 | 7/2018 | Siddik et al. |
| 2001/0024853 A1 | 9/2001 | Wallace et al. |
| 2002/0089874 A1 | 7/2002 | Nickel et al. |
| 2002/0097534 A1 | 7/2002 | Sun et al. |
| 2002/0105827 A1 | 8/2002 | Redon et al. |
| 2002/0114112 A1 | 8/2002 | Nakashio et al. |
| 2003/0011939 A1 | 1/2003 | Gill |
| 2003/0030434 A1 | 2/2003 | Hasegawa et al. |
| 2003/0035255 A1 | 2/2003 | Hasegawa et al. |
| 2003/0063415 A1 | 4/2003 | Hasegawa et al. |
| 2003/0064569 A1 | 4/2003 | Takayama et al. |
| 2003/0103371 A1 | 6/2003 | Kim et al. |
| 2003/0142562 A1 | 7/2003 | Kreupl |
| 2003/0199104 A1 | 10/2003 | Leuschner et al. |
| 2004/0008455 A1 | 1/2004 | Hasegawa et al. |
| 2004/0075959 A1 | 4/2004 | Gill |
| 2004/0091744 A1 | 5/2004 | Carey et al. |
| 2004/0144995 A1 | 7/2004 | Nagahama et al. |
| 2004/0174740 A1 | 9/2004 | Lee et al. |
| 2004/0224243 A1 | 11/2004 | Yoshizawa et al. |
| 2004/0233760 A1 | 11/2004 | Guo et al. |
| 2004/0246776 A1 | 12/2004 | Covington |
| 2005/0019608 A1 | 1/2005 | Kim et al. |
| 2005/0024786 A1 | 2/2005 | Gill et al. |
| 2005/0036361 A1 | 2/2005 | Fukuzumi |
| 2005/0068683 A1 | 3/2005 | Gill |
| 2005/0087511 A1 | 4/2005 | Sharma et al. |
| 2005/0106810 A1 | 5/2005 | Pakala et al. |
| 2005/0164414 A1 | 7/2005 | Deak |
| 2005/0173698 A1 | 8/2005 | Drewes |
| 2005/0189574 A1 | 9/2005 | Nguyen et al. |
| 2005/0211973 A1 | 9/2005 | Mori et al. |
| 2005/0230743 A1 | 10/2005 | Nakagawa et al. |
| 2005/0231853 A1 | 10/2005 | Li et al. |
| 2005/0233174 A1 | 10/2005 | Munteanu et al. |
| 2005/0276099 A1 | 12/2005 | Horng et al. |
| 2006/0002039 A1 | 1/2006 | Hasegawa et al. |
| 2006/0038213 A1 | 2/2006 | Mori et al. |
| 2006/0042930 A1 | 3/2006 | Mauri |
| 2006/0098354 A1 | 5/2006 | Parkin |
| 2006/0114714 A1 | 6/2006 | Kanegae |
| 2006/0118842 A1 | 6/2006 | Iwata |
| 2006/0261425 A1 | 11/2006 | Suemitsu et al. |
| 2007/0008661 A1 | 1/2007 | Min et al. |
| 2007/0026260 A1 | 2/2007 | Nemoto et al. |
| 2007/0026263 A1 | 2/2007 | Kubota et al. |
| 2007/0035890 A1 | 2/2007 | Sbiaa |

(56) References Cited

U.S. PATENT DOCUMENTS

| | | |
|---|---|---|
| 2007/0053112 A1 | 3/2007 | Papworth Parkin |
| 2007/0086121 A1 | 4/2007 | Nagase et al. |
| 2007/0132003 A1 | 6/2007 | Takashima et al. |
| 2007/0201265 A1 | 8/2007 | Ranjan et al. |
| 2007/0217071 A1 | 9/2007 | Inamura et al. |
| 2007/0247756 A1 | 10/2007 | Lai et al. |
| 2007/0253116 A1 | 11/2007 | Takahashi |
| 2007/0279977 A1 | 12/2007 | Banerjee et al. |
| 2007/0297220 A1 | 12/2007 | Yoshikawa et al. |
| 2008/0164502 A1 | 7/2008 | Fukumoto et al. |
| 2008/0164548 A1 | 7/2008 | Ranjan et al. |
| 2008/0170329 A1 | 7/2008 | Thangaraj et al. |
| 2008/0179699 A1 | 7/2008 | Horng et al. |
| 2008/0182131 A1 | 7/2008 | Iwasaki |
| 2008/0198512 A1 | 8/2008 | Mukai |
| 2008/0205130 A1 | 8/2008 | Sun et al. |
| 2008/0225581 A1 | 9/2008 | Yamane et al. |
| 2008/0242088 A1 | 10/2008 | Suzuki |
| 2008/0253039 A1 | 10/2008 | Nagamine et al. |
| 2008/0278867 A1 | 11/2008 | Fukumoto et al. |
| 2009/0039450 A1 | 2/2009 | Lee et al. |
| 2009/0079018 A1 | 3/2009 | Nagase et al. |
| 2009/0096043 A1 | 4/2009 | Min et al. |
| 2009/0108383 A1 | 4/2009 | Horng et al. |
| 2009/0168238 A1 | 7/2009 | Kim et al. |
| 2009/0180215 A1 | 7/2009 | Ishikawa et al. |
| 2009/0190262 A1 | 7/2009 | Murakami et al. |
| 2009/0195924 A1 | 8/2009 | Nemoto et al. |
| 2009/0218645 A1 | 9/2009 | Ranjan et al. |
| 2009/0229111 A1 | 9/2009 | Zhao et al. |
| 2009/0231909 A1 | 9/2009 | Dieny et al. |
| 2009/0250776 A1 | 10/2009 | Takenaga et al. |
| 2009/0251829 A1 | 10/2009 | Zhang et al. |
| 2009/0256220 A1 | 10/2009 | Horng et al. |
| 2009/0257151 A1 | 10/2009 | Zhang et al. |
| 2010/0034014 A1 | 2/2010 | Ohno et al. |
| 2010/0035085 A1 | 2/2010 | Jung et al. |
| 2010/0080036 A1 | 4/2010 | Liu et al. |
| 2010/0080048 A1 | 4/2010 | Liu et al. |
| 2010/0086809 A1 | 4/2010 | Kuboki |
| 2010/0096716 A1 | 4/2010 | Ranjan et al. |
| 2010/0102406 A1 | 4/2010 | Xi et al. |
| 2010/0109110 A1 | 5/2010 | Wang et al. |
| 2010/0109111 A1 | 5/2010 | Shin et al. |
| 2010/0110783 A1 | 5/2010 | Liu et al. |
| 2010/0140726 A1 | 6/2010 | Apalkov et al. |
| 2010/0148167 A1 | 6/2010 | Whig et al. |
| 2010/0171086 A1 | 7/2010 | Lung et al. |
| 2010/0176472 A1 | 7/2010 | Shoji |
| 2010/0177557 A1 | 7/2010 | Liu et al. |
| 2010/0177561 A1 | 7/2010 | Liu et al. |
| 2010/0200899 A1 | 8/2010 | Marukame et al. |
| 2010/0219491 A1 | 9/2010 | Lee et al. |
| 2010/0220516 A1 | 9/2010 | Lee et al. |
| 2010/0230769 A1 | 9/2010 | Ozaki et al. |
| 2010/0240151 A1 | 9/2010 | Belen et al. |
| 2010/0276771 A1 | 11/2010 | Fukumoto et al. |
| 2010/0327248 A1 | 12/2010 | Khoueir et al. |
| 2010/0328822 A1 | 12/2010 | Park et al. |
| 2011/0007429 A1 | 1/2011 | Dimitrov et al. |
| 2011/0007543 A1 | 1/2011 | Khoury |
| 2011/0014500 A1 | 1/2011 | Horng et al. |
| 2011/0031569 A1 | 2/2011 | Watts et al. |
| 2011/0049657 A1 | 3/2011 | Tsukamoto et al. |
| 2011/0049658 A1 | 3/2011 | Zheng et al. |
| 2011/0051503 A1 | 3/2011 | Hu et al. |
| 2011/0062537 A1 | 3/2011 | Oh et al. |
| 2011/0064969 A1 | 3/2011 | Chen et al. |
| 2011/0086439 A1 | 4/2011 | Choi |
| 2011/0096443 A1 | 4/2011 | Zhang et al. |
| 2011/0121366 A1 | 5/2011 | Or-Bach et al. |
| 2011/0134563 A1 | 6/2011 | Komagaki et al. |
| 2011/0145514 A1 | 6/2011 | Lee et al. |
| 2011/0149646 A1 | 6/2011 | Liu et al. |
| 2011/0149647 A1 | 6/2011 | Kim et al. |
| 2011/0149670 A1 | 6/2011 | Heo et al. |
| 2011/0151280 A1 | 6/2011 | Takahashi et al. |
| 2011/0170339 A1 | 7/2011 | Wunderlich et al. |
| 2011/0170341 A1 | 7/2011 | Butler |
| 2011/0194329 A1 | 8/2011 | Ohba et al. |
| 2011/0241138 A1 | 10/2011 | Hsieh et al. |
| 2011/0260274 A1 | 10/2011 | Zheng et al. |
| 2011/0266642 A1 | 11/2011 | Viala et al. |
| 2011/0269251 A1 | 11/2011 | Kim et al. |
| 2011/0293967 A1 | 12/2011 | Zhang et al. |
| 2011/0298456 A1 | 12/2011 | Lu et al. |
| 2011/0303995 A1 | 12/2011 | Worledge |
| 2011/0303997 A1 | 12/2011 | Wang et al. |
| 2011/0309418 A1 | 12/2011 | Nakayama et al. |
| 2012/0012952 A1 | 1/2012 | Chen et al. |
| 2012/0012953 A1 | 1/2012 | Lottis et al. |
| 2012/0012954 A1 | 1/2012 | Yamada et al. |
| 2012/0015099 A1 | 1/2012 | Sun et al. |
| 2012/0018823 A1 | 1/2012 | Huai et al. |
| 2012/0018824 A1 | 1/2012 | Lim et al. |
| 2012/0018825 A1 | 1/2012 | Lim et al. |
| 2012/0023386 A1 | 1/2012 | Oh et al. |
| 2012/0040207 A1 | 2/2012 | Horng et al. |
| 2012/0061781 A1 | 3/2012 | Ohmori et al. |
| 2012/0068139 A1 | 3/2012 | Daibou et al. |
| 2012/0069647 A1 | 3/2012 | Kramer et al. |
| 2012/0074511 A1 | 3/2012 | Takahashi et al. |
| 2012/0075922 A1 | 3/2012 | Yamada et al. |
| 2012/0075927 A1 | 3/2012 | Chen et al. |
| 2012/0106233 A1 | 5/2012 | Katti |
| 2012/0112297 A1 | 5/2012 | Yamakawa et al. |
| 2012/0134201 A1 | 5/2012 | Ogimoto |
| 2012/0135273 A1 | 5/2012 | Horng et al. |
| 2012/0146167 A1* | 6/2012 | Huai ............... G11C 11/161 257/421 |
| 2012/0155156 A1 | 6/2012 | Watts et al. |
| 2012/0164485 A1 | 6/2012 | Lin |
| 2012/0181537 A1 | 7/2012 | Cao et al. |
| 2012/0182796 A1 | 7/2012 | Uchida et al. |
| 2012/0205758 A1 | 8/2012 | Jan et al. |
| 2012/0217594 A1 | 8/2012 | Kajiyama |
| 2012/0217599 A1 | 8/2012 | Nam et al. |
| 2012/0218813 A1 | 8/2012 | Oh et al. |
| 2012/0225499 A1 | 9/2012 | Nozieres et al. |
| 2012/0236631 A1 | 9/2012 | Park et al. |
| 2012/0241878 A1 | 9/2012 | Hu et al. |
| 2012/0241879 A1 | 9/2012 | Ikeno et al. |
| 2012/0261777 A1 | 10/2012 | Shukh |
| 2012/0267733 A1 | 10/2012 | Hu et al. |
| 2012/0280336 A1 | 11/2012 | Jan et al. |
| 2012/0286382 A1 | 11/2012 | Jan et al. |
| 2012/0299134 A1 | 11/2012 | Jan et al. |
| 2012/0299137 A1 | 11/2012 | Worledge |
| 2012/0300542 A1 | 11/2012 | Uchida et al. |
| 2013/0005052 A1 | 1/2013 | Hu et al. |
| 2013/0015539 A1 | 1/2013 | Choi |
| 2013/0028013 A1 | 1/2013 | Ikeda et al. |
| 2013/0032911 A1 | 2/2013 | Jung et al. |
| 2013/0042081 A1 | 2/2013 | Park et al. |
| 2013/0043471 A1 | 2/2013 | Cao et al. |
| 2013/0059168 A1 | 3/2013 | Tahmasebi et al. |
| 2013/0064011 A1 | 3/2013 | Liu et al. |
| 2013/0069185 A1 | 3/2013 | Saida et al. |
| 2013/0075839 A1 | 3/2013 | Chen et al. |
| 2013/0134534 A1 | 5/2013 | Sbiaa et al. |
| 2013/0140658 A1 | 6/2013 | Yamane et al. |
| 2013/0146996 A1 | 6/2013 | Yu et al. |
| 2013/0148418 A1 | 6/2013 | Luo et al. |
| 2013/0154038 A1 | 6/2013 | Horng et al. |
| 2013/0177781 A1 | 7/2013 | Chepulskyy et al. |
| 2013/0209836 A1 | 8/2013 | Ataka et al. |
| 2013/0221459 A1 | 8/2013 | Jan et al. |
| 2013/0224521 A1 | 8/2013 | Wang et al. |
| 2013/0228884 A1 | 9/2013 | Zheng et al. |
| 2013/0229866 A1 | 9/2013 | Ranjan et al. |
| 2013/0236639 A1 | 9/2013 | Carey et al. |
| 2013/0242435 A1 | 9/2013 | Fuji et al. |
| 2013/0250661 A1 | 9/2013 | Sandhu et al. |
| 2013/0288392 A1 | 10/2013 | Nozieres et al. |

(56) References Cited

U.S. PATENT DOCUMENTS

| | | | |
|---|---|---|---|
| 2013/0288398 A1 | 10/2013 | Yamamoto et al. |
| 2013/0313665 A1 | 11/2013 | Rhie et al. |
| 2013/0314815 A1 | 11/2013 | Yuan et al. |
| 2013/0334630 A1 | 12/2013 | Kula et al. |
| 2013/0334631 A1 | 12/2013 | Kinney et al. |
| 2014/0008742 A1 | 1/2014 | Chen et al. |
| 2014/0015076 A1 | 1/2014 | Gan et al. |
| 2014/0021426 A1 | 1/2014 | Lee et al. |
| 2014/0027869 A1 | 1/2014 | Lee et al. |
| 2014/0038312 A1 | 2/2014 | Lee et al. |
| 2014/0063656 A1 | 3/2014 | Hashimoto |
| 2014/0064047 A1 | 3/2014 | Niwa et al. |
| 2014/0070341 A1 | 3/2014 | Beach et al. |
| 2014/0084398 A1 | 3/2014 | Oguz et al. |
| 2014/0099735 A1 | 4/2014 | Horng et al. |
| 2014/0116984 A1 | 5/2014 | Ding et al. |
| 2014/0151843 A1 | 6/2014 | Millward et al. |
| 2014/0157065 A1 | 6/2014 | Ong |
| 2014/0217526 A1 | 8/2014 | Guo |
| 2014/0242419 A1 | 8/2014 | Singh et al. |
| 2014/0264663 A1 | 9/2014 | Chen et al. |
| 2014/0268301 A1 | 9/2014 | Ding et al. |
| 2014/0269064 A1 | 9/2014 | Jeon et al. |
| 2014/0272454 A1 | 9/2014 | Zhang et al. |
| 2014/0287537 A1 | 9/2014 | Shukh |
| 2014/0293436 A1 | 10/2014 | Nagahama et al. |
| 2014/0308542 A1 | 10/2014 | Zhang et al. |
| 2014/0327095 A1 | 11/2014 | Kim et al. |
| 2014/0334032 A1 | 11/2014 | Nishioka et al. |
| 2014/0339504 A1 | 11/2014 | Kim et al. |
| 2014/0367814 A1 | 12/2014 | Ohmori et al. |
| 2015/0028439 A1 | 1/2015 | Kula et al. |
| 2015/0041933 A1 | 2/2015 | Chepulskyy et al. |
| 2015/0069556 A1 | 3/2015 | Yamakawa et al. |
| 2015/0076485 A1 | 3/2015 | Sandhu et al. |
| 2015/0076633 A1 | 3/2015 | Siddik et al. |
| 2015/0179916 A1 | 6/2015 | Pramanik et al. |
| 2015/0249202 A1 | 9/2015 | Siddik et al. |
| 2015/0270478 A1 | 9/2015 | Annunziata et al. |
| 2015/0287910 A1 | 10/2015 | Lu et al. |
| 2015/0295164 A1 | 10/2015 | Sandhu et al. |
| 2015/0303372 A1 | 10/2015 | Meade et al. |
| 2015/0340601 A1 | 11/2015 | Huai et al. |
| 2016/0005954 A1 | 1/2016 | Erickson et al. |
| 2016/0086645 A1 | 3/2016 | Erickson et al. |
| 2016/0111632 A1 | 4/2016 | Sandhu et al. |
| 2016/0155932 A1 | 6/2016 | Chen et al. |

FOREIGN PATENT DOCUMENTS

| | | | |
|---|---|---|---|
| CN | 101461064 A | 6/2009 |
| CN | 102246327 A | 11/2011 |
| CN | 102610270 A | 7/2012 |
| CN | 104241286 A | 12/2014 |
| EP | 1353443 A2 | 10/2003 |
| EP | 1885006 A1 | 2/2008 |
| EP | 2385548 A1 | 11/2011 |
| EP | 2541554 A1 | 1/2013 |
| EP | 2015307 B1 | 10/2013 |
| GB | 2343308 A | 5/2000 |
| JP | 2002314049 A | 10/2002 |
| JP | 2004104076 A | 4/2004 |
| JP | 2004179668 A | 6/2004 |
| JP | 2006165059 A | 6/2006 |
| JP | 2007173843 A | 7/2007 |
| JP | 2008010590 A | 1/2008 |
| JP | 2008192926 A | 8/2008 |
| JP | 2008198792 A | 8/2008 |
| JP | 2008270835 A | 11/2008 |
| JP | 2009194366 A | 8/2009 |
| JP | 2010087355 A | 4/2010 |
| JP | 2010093157 A | 4/2010 |
| JP | 2011119755 A | 6/2011 |
| JP | 2011521391 A | 7/2011 |
| JP | 2012064624 A | 3/2012 |
| JP | 2012-099816 A | 5/2012 |
| JP | 2012142480 A | 7/2012 |
| JP | 2012519957 A | 8/2012 |
| JP | 2012204432 A | 10/2012 |
| JP | 2012244031 A | 12/2012 |
| JP | 2013145846 A | 7/2013 |
| JP | 2013156846 A | 8/2013 |
| JP | 2014-003313 A | 1/2014 |
| KR | 1020040092342 A | 11/2004 |
| KR | 1020070094431 A | 9/2007 |
| KR | 1020080029852 A | 4/2008 |
| KR | 1020120008295 A | 1/2012 |
| KR | 1020120130701 A | 12/2012 |
| WO | 2010026831 A1 | 11/2010 |
| WO | 2010134378 A1 | 11/2010 |
| WO | 2010137679 A1 | 12/2010 |
| WO | 2011001746 A1 | 1/2011 |
| WO | 2011149274 A2 | 12/2011 |
| WO | 2011159422 A1 | 12/2011 |
| WO | 2012086183 A | 6/2012 |
| WO | 2012128891 A1 | 9/2012 |
| WO | 2012160937 A1 | 11/2012 |
| WO | 2013176332 A1 | 11/2013 |
| WO | 2013191920 A1 | 12/2013 |
| WO | 2014097520 A1 | 6/2014 |

OTHER PUBLICATIONS

Rodmacq et al., Influence of Thermal Annealing on the Perpendicular Magnetic Anisotropy of Pt/Co/AlOx Trilayers, Physical Review B, vol. 79, (2009), pp. 024423-1-024423-8.
Sato et al., Perpendicular-Anisotropy CoFeB—MgO Magnetic Tunnel Junctions with a MgO/CoFeB/Ta/CoFeB/MgO Recording Structure, Applied Physics Letters, vol. 101, (2012), pp. 022414-1-022414-4.
Stone et al., Tuning of Ferromagnetism Through Anion Substitution in Ga—Mn-Pnictide Ferromagnetic Semiconductors, Physica B, vol. 401-402, (2007), pp. 454-457.
Tao et al., Uniform Wafer-Scale Chemical Vapor Deposition of Graphene on Evaporated Cu (1 1 1) Film with Quality Comparable to Exfoliated Monolayer, J. Physical Chemistry, vol. 116, (2012), pp. 24068-24074.
Tsunekawa et al., Effect of Capping Layer Material on Tunnel Magnetoresistance in CoFeB—MgO—CoFeB Magentic Tunnel Junctions, Digests of the IEEE International Magnetics Conference (Apr. 2005), pp. 1983-1984.
Taiwanese Office Action and Search Report for Application No. 104132724, (dated Jul. 7, 2016), 14 pages including translation.
Taiwan Decision of Rejection for Taiwanese Application No. 104132724, (dated Jan. 17, 2017), 14 pages including English translation.
Vitos et al., The Surface Energy of Metals, Surface Science, vol. 411, (1998), pp. 186-202.
Wang et al., Exchange Coupling Between Ferromagnetic and Antiferromagnetic Layers Via Ru and Application for a Linear Magnetic Field Sensor, Journal of Applied Physics, vol. 99, (2006), pp. 08H703-1-08H703-3.
Wang et al., C-Spin Kickoff Meeting Presentation, Semiconductor Research Corp., (Mar. 26, 2013), Minneapolis, Minnesota, (available at https://www.src.org/library/publication/p066203/), 195 pages.
Wang et al., "Low-Power Non-volatile Spintronic Memory: STT-MRAM and Beyond," J. Phys. D: Applied Physics, vol. 46, (Jan. 31, 2013), pp. 1-10.
Wilson et al., New Materials for Micro-Scale Sensors and Actuators: An Engineering Review, Materials Science and Engineering R, vol. 56, (2007), pp. 1-129.
Worledge et al., Magnetoresistance Measurement of Unpatterned Magnetic Tunnel Junction Wafers by Current-in-Plane Tunneling, Applied Physics Letters, vol. 83, No. 1, (Jul. 7, 2013), pp. 84-86.
Worledge et al., Spin Torque Switching of Perpendicular Ta|CoFeB|MgO-Based Magnetic Tunnel Junctions, Applied Physics Letters, vol. 98, (2011), pp. 022501-1-022501-3.
Wu et al., Tuning Magnetic Anisotropies of Fe Films on Si(111) Substrate Via Direction Variation of Heating Current, Scientific Reports, vol. 3, (Mar. 26, 2013), pp. 1-5.

(56) References Cited

OTHER PUBLICATIONS

You et al., Spin Transfer Torque and Tunneling Magnetoresistance Dependences on Finite Bias Voltages and Insulator Barrier Energy, Thin Solid Films, vol. 519, (2011), pp. 8247-8251.
Yu et al., 1/f Noise in MgO Double-Barrier Magnetic Tunnel Junctions, Applied Physics Letters, vol. 98, (2011), pp. 112504-1-112504-3.
Zhang, Anisotropic Magnetomechanical Effect in Tb0.3Dy0.7Fe2 Alloy, Journal of Magnetism and Magnetic Materials, vol. 324, (2012), pp. 190-195.
Zhu et al., Magnetic Tunnel Junctions, MaterialsToday, vol. 9, No. 11, (Nov. 2006), pp. 36-45.
Ando et al., Electrically Tunable Spin Injector Free from the Impedance Mismatch Problem, Nature Materials, vol. 10 (Sep. 2011), pp. 655-659.
Apalkov et al., Comparison of Scaling of In-Plane and Perpendicular Spin Transfer Switching Technologies by Micromagnetic Simulation, IEEE Transactions on Magnetics, vol. 46, Issue 6, (Jun. 2010), pp. 2240-2243 (abstract only).
Chen et al., Magnetic Cell Structures, and Methods of Fabrication, U.S. Appl. No. 14/558,367, filed Dec. 2, 2014.
Siddik et al., Semiconductor Devices, Magnetic Tunnel Junctions, and Methods of Fabrication Thereof, U.S. Appl. No. 14/597,903, filed Jan. 15, 2015.
Auwarter et al., Co on h-BN/Ni(1 1 1): From Island to Island-Chain Formation and Co Intercalation, Surface Science, vol. 511, (2002), pp. 379-386.
Bai et al., Boron Diffusion Induced Symmetry Reduction and Scattering in CoFeB/MgO/CoFeB Magnetic Tunnel Junctions, Phys. Rev. B, vol. 87, (Jan. 23, 2013), p. 014114 (abstract only).
Braun et al., Strain-Induced Perpendicular Magnetic Anisotropy in Ultrathin Ni Films on Cu3Au(0 0 1), Journal of Magnetism and Magnetic Materials, vol. 171, (1997), pp. 16-28.
Butler et al., Spin-Dependent Tunneling Conductance of Fe|MgO|Fe Sandwiches, Physical Review B, vol. 63, (Jan. 8, 2001), 054416-1-054416-12.
Carrey et al., Influence of Interface Alloying on the Magnetic Properties of Co/Pd Multilayers, Applied Physics Letters, vol. 83, No. 25, (Dec. 22, 2003), pp. 5259-5261.
Cha et al., Atomic-Scale Spectroscopic Imaging of CoFeB/Mg—B—O/CoFeB Magnetic Tunnel Junctions, Applied Physics Letters, vol. 95, (2009), pp. 032506-1-032506-3.
Chen et al., Advances and Future Prospects of Spin-Transfer Torque Random Access Memory, IEEE Transactions on Magnetics, vol. 46, No. 6, (Jun. 2010), pp. 1873-1878.
Diao et al., Spin Transfer Switching in Dual MgO Magnetic Tunnel Junctions, Applied Physics Letters, vol. 90, (2007), pp. 132508-1-132508-3.
Djayaprawira et al., 230% Room-Temperature Magnetoresistance in CoFeB/MgO/CoFeB Magnetic Tunnel Junctions, Applied Physics Letters, vol. 86, Issue 9, (2005), 2 pages (abstract only).
Farle et al., The Temperature Dependence of Magnetic Anisotropy in Ultra-Thin Films, Journal of Magnetism and Magnetic Materials, vol. 165, (1997), pp. 74-77.
Gan et al., Origin of the Collapse of Tunnel Magnetoresistance at High Annealing Temperature in CoFeB/MgO Perpendicular Magnetic Tunnel Junctions, Applied Physics Letters, vol. 99, (2011), pp. 252507-1-252507-3.
Gao et al., Combinatorial Exploration of Rare-Earth-Free Permanent Magnets: Magnetic and Microstructural Properties of Fe—Co—W Thin Films, Applied Physics Letters, vol. 102, (2013), pp. 022419-1-022419-4.
Greenwood et al., Chemistry of Elements, Second Edition, (1997), pp. 23-25.
Hayakawa et al., Dependence of Giant Tunnel Magnetoresistance of Sputtered CoFeB/MgO/CoFeB Magnetic Tunnel Junctions on MgO Barrier Thickness and Annealing Temperature, Japanese Journal of Applied Physics, vol. 44, No. 19, (2005), pp. L587-L589.
Heczko et al., Strain and Concurrent Magnetization Changes in Magnetic Shape Memory Ni—Mn—Ga Single Crystals—Experiment and Model, Materials Science and Engineering A, vol. 481-482, (2008), pp. 283-287.
Hendrych et al., Magnetic Behavior and Domain Structure in As-Quenched, Annealed, and Stress-Annealed CoFeCrSiB Ribbons, Journal of Magnetism and Magnetic Materials, vol. 321, (2009), pp. 3771-3777.
Hindmarch et al., Zirconium as a Boron Sink in Crystalline CoFeB/MgO/CoFeB Magnetic Tunnel Junctions, the Japan Society of Applied Physics, 2011, pp. 1-3.
Ikeda et al., Tunnel Magnetoresistance of 604% at 300 K by Suppression of Ta Diffusion in CoFeB/MgO/CoFeB Pseudo-Spin-Valves Annealed at High Temperature, Applied Physics Letters, vol. 93, (2008), pp. 082508-1-082508-3.
International Search Report for International Application No. PCT/US2015/051647, (dated Jan. 29, 2016), 3 pages.
International Written Opinion for International Application No. PCT/US2015/051647, (dated Jan. 29, 2016), 5 pages.
Kaufman, Myron, "Principles of Thermodynamics," Taylor & Francis Group LLC, (2002), Chap. 7: Chemical Reactions, 9 pages.
Ke et al., Oxygen-Vacancy-Induced Diffusive Scattering in Fe/MgO/Fe Magnetic Tunnel Junctions, Physical Review Letters, vol. 105, (Nov. 30, 2010), pp. 236801-1-236801-4.
Kim et al., Effect of Annealing on Magnetic Exchange Coupling in CoPt/Co Bilayer Thin Films, Journal of Applied Physics, vol. 87, No. 9, (May 1, 2000), pp. 6140-6142.
Kim et al., Enhancement of Data Retention and Write Current Scaling for Sub-20nm STT-MRAM by Utilizing Dual Interfaces for Perpendicular Magnetic Anisotropy, VLSI Technology (VLSIT), 2012 Symposium, (Jun. 12-14, 2012), 1 page (abstract only).
Knovel Sampler, Knovel, (2003), http://app.knovel.com/web/view/html/show.v/rcid:kpKS000009/cid:kt003BCMZ2/viewerType:html/root_slug:front-matter/url_slug:front-matter?b-q=ioniz; 2 pages.
Ko et al., Effects of MgO and MgO/Pd Seed-Layers on Perpendicular Magnetic Anisotropy of CoPd Thin Films, Thin Solid Films, vol. 519, (2011), pp. 8252-8255.
Kohda et al., Width and Temperature Dependence of Lithography-Induced Magnetic Anisotropy in (Ga,Mn)As Wires, Physica E, vol. 42, (2010), pp. 2685-2689.
Kurt et al., Giant tunneling magnetoresistance with electron beam evaporated MgO barrier and CoFeB electrodes, Journal of Applied Physics, No. 107, (Apr. 30, 2010), pp. 083920-1-083920-6.
Lavrijsen et al., Tuning the Interlayer Exchange Coupling Between Single Perpendicularly Magnetized CoFeB Layers, Appl. Phys. Lett., vol. 100, (2012), pp. 052411-1-052411-5.
Lee et al., Improved Magnetic Tunnel Junction with Amorphous Seed Layer, Surface Treatment, and High-Polarization Magnetic Materials, IEEE Transactions on Magnetics, vol. 40, No. 4, (Jul. 2004), pp. 2275-2277.
Löhndorf et al., Characterization of Magnetostrictive TMR Pressure Sensors by MOKE, Journal of Magnetism and Magnetic Materials, vol. 316, (2007), pp. e223-e225.
Ma et al., NiO-Thickness Dependent Magnetic Anisotropies in Fe/NiO/Au(001) and Fe/NiO/MgO(001) Systems, Journal of Magnetism and Magnetic Materials, vol. 324, (2012), pp. 528-533.
Maehara, et al., Tunnel Magnetoresistance Above 170% and Resistance-Area Product of 1 O (µm)2 Attained by In Situ Annealing of Ultra-Thin MgO Tunnel Barrier, Applied Physics Express, vol. 4, (2011), 2 pages (abstract only).
Matsumoto et al., Dependence on Annealing Temperatures of Tunneling Spectra in High-Resistance CoFeB/MgO/CoFeB Magnetic Tunnel Junctions, Solid State Communications, vol. 143, (2007), pp. 574-578.
Matsumoto et al., Tunneling Spectra of Sputter-Deposited CoFeB/MgO/CoFeB Magnetic Tunnel Junctions Showing Giant Tunneling Magnetoresistance Effect, Solid State Communications, vol. 136, (2005), pp. 611-615.
Miao et al., Disturbance of Tunneling Coherence by Oxygen Vacancy in Epitaxial Fe/MgO/Fe Magnetic Tunnel Junctions, Physical Review Letters, vol. 100, (Jun. 19, 2008), pp. 246803-1-246803-4.

(56) References Cited

OTHER PUBLICATIONS

Miao et al., Theoretical investigation on the transition-metal borides with Ta3B4-type structure: A class of hard and refractory materials, 2011, Computational Materials Science, Elsevier, pp. 1559-1566.

Miracle et al., An Assessment of Binary Metallic Glasses: Correlations Between Structure, Glass Forming Ability and Stability (Preprint), Air Force Research Laboratory, (2011), 97 pages.

Miura et al., CoFeB/MgO Based Perpendicular Magnetic Tunnel Junctions with Stepped Structure for Symmetrizing Different Retention Times of "0" and "1" Information, 2011 Symposium on VLSI Technology (VLSIT), (Jun. 14-16, 2011), 19 pages.

Moroz et al., Modeling the Impact of Stress on Silicon Processes and Devices, Materials Science in Semiconductor Processing, vol. 6, (2003), pp. 27-36.

Moutis et al., Voltage-Induced Modification in Magnetic Coercivity of Patterned Co50Fe50 Thin Film on Piezoelectric Substrate, Journal of Magnetism and Magnetic Materials, vol. 320, (2008), pp. 1050-1055.

Nishitani et al., Magnetic Anisotropy in a Ferromagnetic (Ga,Mn)Sb Thin Film, Physica E, vol. 42, (2010), pp. 2681-2684.

Pinitsoontorn et al., Three-Dimensional Atom Probe Investigation of Boron Distribution in Co Fe B/ Mg O/ Co Fe B Magnetic Tunnel Junctions, Applied Physics Letters, vol. 93, (2008), pp. 071901-1-071901-3.

Piramanayagam, S. N., Perpendicular Recording Media for Hard Disk Drives, Journal of Applied Physics, vol. 102, (2007), pp. 011301-1-011301-22.

Notice of Reasons for Rejection for Korean Application No. 10-2017-7012908, (dated Oct. 12, 2017), 9 pages including English translation.

Chinese Office Action and Search Report from Chinese Application No. 201580055998.8, dated May 3, 2018, 9 pages with English translation.

Isogami et al., "In situ heat treatment of ultrathin MgO layer for giant magnetoresistance ratio with low resistance area product in CoFeB/MgO/CoFeB magnetic tunnel junctions", Applied Physics Letters, vol. 93(19), (2008) pp. 192109-1-192109-3.

Notice of Decision of Rejection from Korean Application No. 10-2017-7012908, dated Feb. 23, 2018, 8 pages including English translation.

Japanese Decision of Rejection for Japanese Application No. 2017-519367, dated Nov. 6, 2018, 6 pages.

* cited by examiner

MAGNETIC DEVICES WITH MAGNETIC AND GETTER REGIONS AND METHODS OF FORMATION

CROSS-REFERENCE TO RELATED APPLICATIONS

This application is a continuation of U.S. patent application Ser. No. 15/162,119, filed May 23, 2016, pending, which is a continuation of U.S. patent application Ser. No. 14/516,347, filed Oct. 16, 2014, now U.S. Pat. No. 9,349,945, issued May 24, 2016, the disclosure of each of which is hereby incorporated in its entirety herein by this reference.

TECHNICAL FIELD

The present disclosure, in various embodiments, relates generally to the field of memory device design and fabrication. More particularly, this disclosure relates to design and fabrication of memory cells characterized as spin torque transfer magnetic random access memory (STT-MRAM) cells, to semiconductor structures employed in such memory cells, and to semiconductor devices incorporating such memory cells.

BACKGROUND

Magnetic Random Access Memory (MRAM) is a non-volatile computer memory technology based on magnetoresistance. One type of MRAM is spin torque transfer MRAM (STT-MRAM), in which a magnetic cell core includes a magnetic tunnel junction ("MTJ") sub-structure with at least two magnetic regions, for example, a "fixed region" and a "free region," with a non-magnetic region between. The free region and the fixed region may exhibit magnetic orientations that are either horizontally oriented ("in-plane") or perpendicularly oriented ("out-of-plane") relative to the width of the regions. The fixed region includes a magnetic material that has a substantially fixed (e.g., a non-switchable) magnetic orientation. The free region, on the other hand, includes a magnetic material that has a magnetic orientation that may be switched, during operation of the cell, between a "parallel" configuration and an "anti-parallel" configuration. In the parallel configuration, the magnetic orientations of the fixed region and the free region are directed in the same direction (e.g., north and north, east and east, south and south, or west and west, respectively). In the "anti-parallel" configuration, the magnetic orientations of the fixed region and the free region are directed in opposite directions (e.g., north and south, east and west, south and north, or west and east, respectively). In the parallel configuration, the STT-MRAM cell exhibits a lower electrical resistance across the magnetoresistive elements (e.g., the fixed region and free region), defining a "0" logic state of the MRAM cell. In the anti-parallel configuration, the STT-MRAM cell exhibits a higher electrical resistance across the magnetoresistive elements, defining a "1" logic state of the STT-MRAM cell.

Switching of the magnetic orientation of the free region may be accomplished by passing a programming current through the magnetic cell core, including the fixed and free regions. The fixed region polarizes the electron spin of the programming current, and torque is created as the spin-polarized current passes through the core. The spin-polarized electron current exerts the torque on the free region. When the torque of the spin-polarized electron current is greater than a critical switching current density ($J_c$) of the free region, the direction of the magnetic orientation of the free region is switched. Thus, the programming current can be used to alter the electrical resistance across the magnetic regions. The resulting high or low electrical resistance states across the magnetoresistive elements enable the write and read operations of the MRAM cell. After switching the magnetic orientation of the free region to achieve the one of the parallel configuration and the anti-parallel configuration associated with a desired logic state, the magnetic orientation of the free region is usually desired to be maintained, during a "storage" stage, until the MRAM cell is to be rewritten to a different configuration (i.e., to a different logic state).

Some STT-MRAM cells include dual oxide regions, i.e., another oxide region in addition to an "intermediate oxide region" (which may also be referred to as a "tunnel barrier") of the MTJ sub-structure. The free region may be between the intermediate oxide region and the another oxide region. The exposure of the free region to two oxide regions may increase the free region's magnetic anisotropy ("MA") strength as well as lower the damping in the cell core. For example, the oxide regions may be configured to induce surface/interfacial MA with neighboring material of, e.g., the free region. MA is an indication of the directional dependence of a magnetic material's magnetic properties. Therefore, the MA is also an indication of the strength of the material's magnetic orientation and of its resistance to alteration of the magnetic orientation. A magnetic material exhibiting a magnetic orientation with a high MA strength may be less prone to alteration of its magnetic orientation than a magnetic material exhibiting a magnetic orientation with a lower MA strength. Moreover, the low damping, provided by the dual oxide regions, may enable use of a low programming current during programming of the cell. A free region with a high MA strength may be more stable during storage than a free region with a low MA strength, and a cell core with low damping may be more efficiently programmed than a cell core with higher damping.

While the dual oxide regions may increase the MA strength of the free region and lower the damping of the cell core, compared to a free region adjacent to only one oxide region (i.e., the intermediate oxide region), the added amount of oxide material in the magnetic cell core may increase the electrical resistance (e.g., the series resistance) of the core, which lowers the effective magnetoresistance (e.g., tunnel magnetoresistance ("TMR")) of the cell, compared to a cell core comprising only one oxide region (i.e., the intermediate oxide region). The increased electrical resistance also increases the resistance-area ("RA") of the cell and may increase the voltage needed to switch the magnetic orientation of the free region during programming. The decreased effective magnetoresistance may degrade performance of the cell, as may the increased RA and programming voltage. Accordingly, forming STT-MRAM cells to have dual oxide regions around the free region, for high MA strength and low damping, without degrading other properties, such as magnetoresistance (e.g., TMR), RA, and programming voltage, has presented challenges.

Other beneficial properties of free regions are often associated with the microstructure of the free regions. These properties include, for example, the cell's TMR. TMR is a ratio of the difference between the cell's electrical resistance in the anti-parallel configuration ($R_{ap}$) and its resistance in the parallel configuration ($R_p$) to $R_p$ (i.e., TMR=$(R_{ap}-R_p)/R_p$). Generally, a free region with a consistent crystal structure (e.g., a bcc (001) crystal structure), having few structural defects in the microstructure of its magnetic material, has a higher TMR than a thin free region with structural defects. A cell with high TMR may have a high read-out signal, which may speed the reading of the MRAM cell during operation. High TMR may accompany high MA and low damping, enabling the use of low programming current.

Efforts have been made to form magnetic material at a desired crystal structure. These efforts include propagating the desired crystal structure to the magnetic material (referred to herein as the "targeted magnetic material") from a neighboring material (referred to herein as the "crystal seed material"), which propagation may be assisted by annealing the materials. However, simultaneously crystallizing both the crystal seed material and the targeted magnetic material may lead to crystallizing the targeted magnetic material in an undesirable crystal structure before the crystal seed material has a desired crystal structure to fully propagate to the targeted magnetic material. Therefore, efforts have been made to delay crystallization of the targeted magnetic material, until after the crystal seed material is crystallized into a desired crystal structure. These efforts have included incorporating an additive in the targeted magnetic material so the material is amorphous when first formed. The additive may diffuse out of the targeted magnetic material during the anneal, enabling the targeted magnetic material to crystallize under propagation from the crystal seed material, after the crystal seed material has crystallized into the desired crystal structure. However, these efforts do not inhibit the propagation of competing crystal structures from neighboring materials other than the crystal seed material. Moreover, the additive diffusing from the targeted magnetic material may diffuse to regions within the structure where the additive interferes with other characteristics of the structure, e.g., MA strength. Therefore, forming a magnetic material with a desired microstructure, e.g., to enable a high TMR, while not deteriorating other characteristics of the magnetic material or the resulting structure, such as MA strength, can also present challenges.

BRIEF DESCRIPTION OF THE DRAWINGS

FIGS. 2 through 5 are cross-sectional, elevational, schematic illustrations during various stages of processing to fabricate the magnetic cell structures of FIGS. 1, 1A, and 1B, according to embodiments of the present disclosure, wherein:

FIG. 2 is a cross-sectional, elevational, schematic illustration of a structure during a stage of processing forming a precursor getter seed material;

FIG. 3 is a cross-sectional, elevational, schematic illustration of a stage of processing following that of FIG. 2, wherein a precursor oxide material and a precursor magnetic material are formed to overlay the precursor getter seed material;

FIG. 4 is a cross-sectional, elevational, schematic illustration of a stage of processing following that of FIG. 3, wherein the structure of FIG. 3 has been annealed;

FIG. 5 is a cross-sectional, elevational, schematic illustration of a precursor structure during a stage of processing following that of FIG. 4, according to an embodiment of the present disclosure.

FIGS. 7 through 9 are cross-sectional, elevational, schematic illustrations during various stages of processing to fabricate the magnetic cell structure of FIG. 6, according to embodiments of the present disclosure, wherein:

FIG. 7 is a cross-sectional, elevational, schematic illustration of a structure during a stage of processing wherein a precursor getter oxide material and a precursor magnetic material are formed to overlay a precursor getter seed material;

FIG. 8 is a cross-sectional, elevational, schematic illustration of a stage of processing following that of FIG. 7, wherein the structure of FIG. 7 has been annealed;

FIG. 9 is a cross-sectional, elevational, schematic illustration of a precursor structure during a stage of processing following that of FIG. 8, according to an embodiment of the present disclosure.

DETAILED DESCRIPTION

Figure 1:
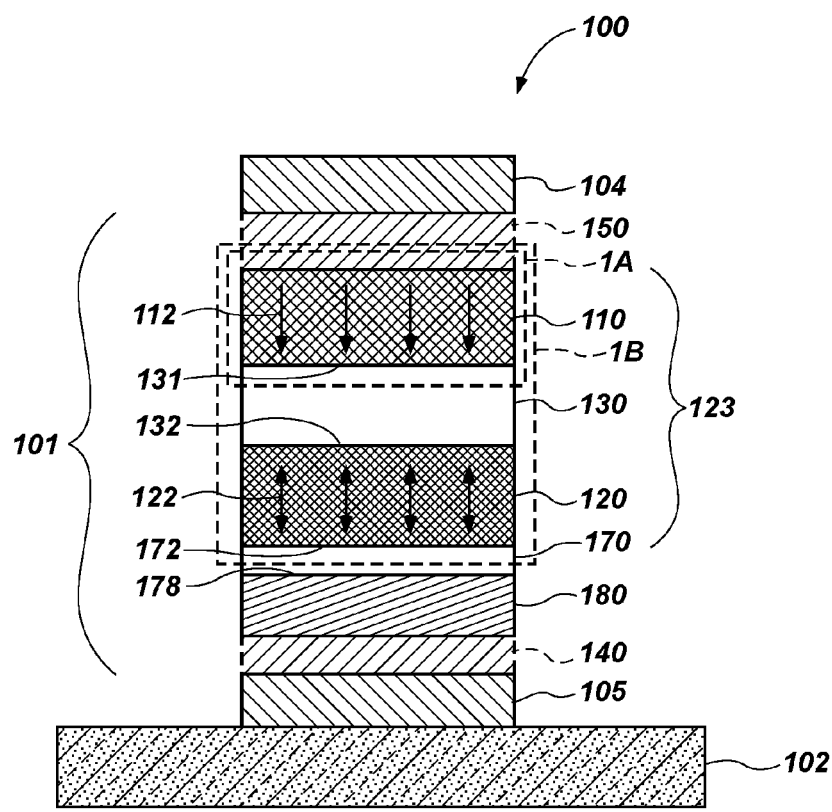
FIG. 1 is a cross-sectional, elevational, schematic illustration of a magnetic cell structure according to an embodiment of the present disclosure, wherein a getter seed region is adjacent to a secondary oxide region.

Memory cells, semiconductor structures, semiconductor devices, memory systems, electronic systems, methods of forming memory cells, and methods of forming semiconductor structures are disclosed. During fabrication of the memory cell, a "diffusive species" is at least partially removed from a magnetic material, which may also be characterized herein as a "precursor magnetic material," due to a chemical affinity between the diffusive species and at least one "getter species" of a proximate material, such as a "precursor getter seed material." Additionally, during fabrication of the memory cell, another diffusive species, such as oxygen, is at least partially removed from an oxide material, which may also be characterized herein as a "precursor oxide material," due to a chemical affinity between the oxygen and at least another getter species, such as an oxygen-getter species, of the precursor getter seed material.

The removal of the diffusive species from the precursor magnetic material, which forms what may be characterized as a "depleted magnetic material," promotes crystallization of the depleted magnetic material into a desired crystal structure (e.g., a bcc (001) structure), e.g., due to crystal structure propagation from another neighboring material. This crystallization promotes high tunnel magnetoresistance ("TMR") in the resulting cell core structure.

The removal of the oxygen from the precursor oxide material, which forms what may be characterized as an "oxygen-depleted material," lowers the electrical resistance of the oxide material, which promotes low damping and low resistance area ("RA") of the resulting cell core structure. Thus, the resulting cell core structure includes dual oxide regions proximate the free region, without the secondary oxide region substantially increasing damping and electrical resistance.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

As used herein, the term "STT-MRAM cell" means and includes a magnetic cell structure that includes a magnetic cell core including a nonmagnetic region disposed between a free region and a fixed region. The nonmagnetic region may be an electrically insulative (e.g., dielectric) region of a magnetic tunnel junction ("MTJ") structure. The MTJ structure comprises the nonmagnetic region between the free region and the fixed region. For example, the nonmagnetic region, between the free and fixed regions, may be an oxide region (referred to herein as the "intermediate oxide region").

As used herein, the term "secondary oxide region" refers to an oxide region of an STT-MRAM cell other than the intermediate oxide region. The secondary oxide region may be formulated and positioned to induce magnetic anisotropy ("MA") with a neighboring magnetic material, e.g., the free region.

As used herein, the term "magnetic cell core" means and includes a memory cell structure comprising the free region and the fixed region and through which, during use and operation of the memory cell, current may be passed (i.e., flowed) to effect a parallel or anti-parallel configuration of the magnetic orientations of the free region and the fixed region.

As used herein, the term "magnetic region" means a region that exhibits magnetism. A magnetic region includes a magnetic material and may also include one or more non-magnetic materials.

As used herein, the term "magnetic material" means and includes ferromagnetic materials, ferrimagnetic materials, antiferromagnetic, and paramagnetic materials.

As used herein, the terms "CoFeB material" and "CoFeB precursor material" mean and include a material comprising cobalt (Co), iron (Fe), and boron (B) (e.g., $Co_xFe_yB_z$, wherein x=10 to 80, y=10 to 80, and z=0 to 50). A CoFeB material or a CoFeB precursor material may or may not exhibit magnetism, depending on its configuration (e.g., its thickness).

As used herein, the term "species" means and includes an element or elements from the Periodic Table of Elements composing a material. For example, and without limitation, in a CoFeB material, each of Co, Fe, and B may be referred to as species of the CoFeB material.

As used herein, the term "diffusive species" means and includes a chemical species of a material, the absence of which would not prohibit desirable functionality of the material. For example, and without limitation, in a CoFeB material of a magnetic region, boron (B) may be referred to as a diffusive species in that the cobalt (Co) and iron (Fe) may nonetheless function as a magnetic material (i.e., exhibit magnetism) without the boron (B) present. As another example, and without limitation, in a magnesium oxide (MgO) material of a secondary oxide region, the oxygen (O) may be referred to as a diffusive species in that the MgO may nonetheless function to induce MA with a neighboring magnetic material with substantially less oxygen (O) present in the material. For example, the MgO may function to induce interfacial-MA provided oxygen (O) is present along an interface with the magnetic material, even without oxygen (O) throughout the rest of the body of the MA-inducing material. Following diffusion, the "diffusive species" may be referred to as a "diffused species."

As used herein, the term "depleted," when used to describe a material, describes a material resulting from removal, in whole or part, of a diffusive species from a precursor material.

As used herein, the term "enriched," when used to describe a material, describes a material to which the diffused species has been added (e.g., transferred).

As used herein, the term "precursor," when referring to a material, region, or structure, means and refers to a material, region, or structure to be transformed into a resulting material, region, or structure. For example, and without limitation, a "precursor material" may refer to a material from which a species is to be diffused to transform the precursor material into a depleted material; a "precursor material" may refer to a material into which a species is to be diffused to transform the precursor material into an enriched material; a "precursor material" may refer to a material into which a species it to be diffused, and from which another species is to be diffused, to transform the precursor material into an "enriched-depleted" material; and "a precursor structure" may refer to a structure of materials or regions to be patterned to transform the precursor structure into a resulting, patterned structure.

As used herein, unless the context indicates otherwise, the term "formed from," when describing a material or region, refers to a material or region that has resulted from an act that produced a transformation of a precursor material or precursor region.

As used herein, the term "chemical affinity" means and refers to the electronic property by which dissimilar chemical species tend to form chemical compounds. Chemical affinity may be indicated by the heat of formation of the chemical compound. For example, a first material described as having a higher chemical affinity for a diffusive species of a second material, e.g., compared to the chemical affinity between the diffusive species and other species of the second material means, includes that a heat of formation of a chemical compound that includes the diffusive species and at least one species from the first material is lower than a heat of formation of a chemical compound that includes the diffusive species and the other species of the second material.

As used herein, the term "amorphous," when referring to a material, means and refers to a material having a noncrystalline structure. For example, and without limitation, an "amorphous" material includes glass.

As used herein, the term "fixed region" means and includes a magnetic region within the STT-MRAM cell that includes a magnetic material and that has a fixed magnetic orientation during use and operation of the STT-MRAM cell in that a current or applied field effecting a change in the magnetization direction of one magnetic region (e.g., the free region) of the cell core may not effect a change in the magnetization direction of the fixed region. The fixed region may include one or more magnetic materials and, optionally, one or more non-magnetic materials. For example, the fixed region may be configured as a synthetic antiferromagnet (SAF) including a sub-region of ruthenium (Ru) adjoined by magnetic sub-regions. Alternatively, the fixed region may be configured with structures of alternating sub-regions of magnetic material and coupler material. Each of the magnetic sub-regions may include one or more materials and one or more regions therein. As another example, the fixed region may be configured as a single, homogeneous magnetic material. Accordingly, the fixed region may have uniform magnetization, or sub-regions of differing magnetization that, overall, effect the fixed region having a fixed magnetic orientation during use and operation of the STT-MRAM cell.

As used herein, the term "coupler," when referring to a material, region, or sub-region, means and includes a material, region, or sub-region formulated or otherwise configured to antiferromagnetically couple neighboring magnetic materials, regions, or sub-regions.

As used herein, the term "free region" means and includes a magnetic region within the STT-MRAM cell that includes a magnetic material and that has a switchable magnetic orientation during use and operation of the STT-MRAM cell. The magnetic orientation may be switched between a parallel configuration and an anti-parallel configuration by the application of a current or applied field.

As used herein, the term "switching" means and includes a stage of use and operation of the memory cell during which programming current is passed through the magnetic cell core of the STT-MRAM cell to effect a parallel or anti-parallel configuration of the magnetic orientations of the free region and the fixed region.

As used herein, the term "storage" means and includes a stage of use and operation of the memory cell during which programming current is not passed through the magnetic cell core of the STT-MRAM cell and in which the parallel or anti-parallel configuration of the magnetic orientations of the free region and the fixed region is not purposefully altered.

As used herein, the term "vertical" means and includes a direction that is perpendicular to the width and length of the respective region. "Vertical" may also mean and include a direction that is perpendicular to a primary surface of the substrate on which the STT-MRAM cell is located.

As used herein, the term "horizontal" means and includes a direction that is parallel to at least one of the width and length of the respective region. "Horizontal" may also mean and include a direction that is parallel to a primary surface of the substrate on which the STT-MRAM cell is located.

As used herein, the term "sub-region" means and includes a region included in another region. Thus, one magnetic region may include one or more magnetic sub-regions, i.e., sub-regions of magnetic material, as well as non-magnetic sub-regions, i.e., sub-regions of non-magnetic material.

As used herein, the term "sub-structure" means and includes a structure included as part of another structure. Thus, one cell core structure may include one or more sub-structures, e.g., an MTJ sub-structure.

As used herein, the term "between" is a spatially relative term used to describe the relative disposition of one material, region, or sub-region relative to at least two other materials, regions, or sub-regions. The term "between" can encompass both a disposition of one material, region, or sub-region directly adjacent to the other materials, regions, or sub-regions and a disposition of one material, region, or sub-region indirectly adjacent to the other materials, regions, or sub-regions.

As used herein, the term "proximate to" is a spatially relative term used to describe disposition of one material, region, or sub-region near to another material, region, or sub-region. The term "proximate" includes dispositions of indirectly adjacent to, directly adjacent to, and internal to.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90 degrees, inverted, etc.) and the spatially relative descriptors used herein interpreted accordingly.

As used herein, the terms "comprises," "comprising," "includes," and/or "including" specify the presence of stated features, regions, stages, operations, elements, materials, components, and/or groups, but do not preclude the presence or addition of one or more other features, regions, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular material, species, structure, device, or system, but are merely idealized representations that are employed to describe embodiments of the present disclosure.

Embodiments are described herein with reference to cross-sectional illustrations that are schematic illustrations.

Accordingly, variations from the shapes of the illustrations as a result, for example, of manufacturing techniques and/or tolerances, are to be expected. Thus, embodiments described herein are not to be construed as limited to the particular shapes or regions as illustrated but may include deviations in shapes that result, for example, from manufacturing techniques. For example, a region illustrated or described as box-shaped may have rough and/or nonlinear features. Moreover, sharp angles that are illustrated may be rounded. Thus, the materials, features, and regions illustrated in the figures are schematic in nature and their shapes are not intended to illustrate the precise shape of a material, feature, or region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, ion milling, abrasive planarization, or other known methods.

Reference will now be made to the drawings, where like numerals refer to like components throughout. The drawings are not necessarily drawn to scale.

A memory cell is disclosed. The memory cell includes a magnetic cell core that includes a magnetic tunnel junction ("MTJ") sub-structure, a secondary oxide region, and a getter seed region. The getter seed region comprises a getter species having a chemical affinity for a diffusive species of a precursor magnetic material of the MTJ sub-structure. The getter seed region also comprises an oxygen-getter species having a chemical affinity for oxygen from the secondary oxide region. During formation of the memory cell, the diffusive species is transferred from the precursor magnetic material to the getter seed region. Also during formation of the memory cell, oxygen from the secondary oxide region is transferred from a precursor oxide material to the getter seed region.

The removal of the diffusive species from the precursor magnetic material may enable and improve crystallization of the resulting depleted magnetic material. For example, once the diffusive species has been removed from the precursor magnetic material, a crystalline structure may propagate to the depleted magnetic material from a neighboring crystalline material, e.g., a crystalline oxide material of, e.g., the intermediate oxide region of the MTJ sub-structure. Moreover, the resulting, enriched getter seed region may remain or become amorphous. The amorphous nature of the enriched trap material may not compete or otherwise negatively impact the propagation of the crystal structure from the adjacent crystalline material, e.g., oxide material of the intermediate oxide region, to the depleted magnetic material. In some embodiments, the enriched trap material may be amorphous even at high temperatures (e.g., greater than about 300° C., e.g., greater than about 500° C.). Therefore, a high temperature anneal may be used to promote the crystallization of the depleted magnetic material without crystallizing the enriched getter seed material. The crystallization of the depleted magnetic material may enable a high TMR (e.g., greater than about 100%, e.g., greater than about 120%). Moreover, the retention of the diffused species in the enriched getter seed material, via bonding with the getter species, may inhibit the diffused species from interfering with MA-inducement along the interface between the magnetic region and an adjacent intermediate oxide region. Without being limited to any one theory, it is contemplated that bonds between the nonmagnetic and magnetic materials (e.g., between iron (Fe), in the magnetic region, and oxygen (O) in the nonmagnetic region, i.e., iron-oxygen (Fe—O) bonds), may contribute to the higher MA strength and high TMR. Less or no diffusive species at the interfaces between the depleted magnetic material and neighboring oxide regions may enable more MA-inducing bonds and spin-filtering bonds to be formed. Therefore, the lack of interference by the diffused species with the MA-inducing bonds may enable high MA strength and TMR.

The removal of the oxygen from the precursor oxide material of the secondary oxide region may enable a low electrical resistance in the resulting depleted oxide material of the secondary oxide region and low damping in the final cell core structure. It is contemplated, however, that not all oxygen be removed from the precursor oxide material. Rather, any oxygen remaining in the resulting depleted oxide material (which may be referred to herein as "residual oxygen") may include a maximum concentration of oxygen along an interface between the secondary oxide region and a neighboring magnetic material, e.g., of the free region in the MTJ sub-structure. Thus, MA-inducing bonds between, e.g., iron (Fe) in the depleted magnetic material and residual oxygen (O) in the depleted oxide region may still form and induce interfacial-MA. Thus, dual oxide regions may be used to promote high MA inducement, while the depletion of oxygen concentration in the secondary oxide region may enable low electrical resistance and low damping, in the cell core structure, even with a second oxide region included in the structure.

With the depletion of the diffusive species from the precursor magnetic material, to promote crystallization, and with the depletion of the oxygen from the precursor oxide material, to promote low electrical resistance and low damping, a magnetic memory cell may be formed with high TMR, high MA strength, low electrical resistance (including low resistance-area ("RA")), and low damping.

FIG. 1 illustrates an embodiment of a magnetic cell structure 100 according to the present disclosure. The magnetic cell structure 100 includes a magnetic cell core 101 over a substrate 102. The magnetic cell core 101 may be disposed between an upper electrode 104 and a lower electrode 105. The magnetic cell core 101 includes a magnetic region and another magnetic region, for example, a "fixed region" 110 and a "free region" 120, respectively, with an oxide region (e.g., an "intermediate oxide region"

130) between. The sub-structure of the fixed region 110, free region 120, and intermediate oxide region 130 therebetween may be referred to herein as a magnetic tunnel junction ("MTJ") sub-structure 123 or MTJ structure 123. Thus, the intermediate oxide region 130 may be configured as a tunnel barrier region and may contact the fixed region 110 along interface 131 and may contact the free region 120 along interface 132.

Either or both of the fixed region 110 and the free region 120 may be formed homogeneously or, optionally, may be formed to include more than one sub-region. For example, with reference to FIG. 1A, in some embodiments, a fixed region 110' of the magnetic cell core 101 (FIG. 1) may include multiple portions. For example, the fixed region 110' may include a magnetic sub-region as an oxide-adjacent portion 113. An intermediate portion 115, such as a conductive sub-region, may separate the oxide-adjacent portion 113 from an electrode-adjacent portion 117. The electrode-adjacent portion 117 may include an alternating structure of magnetic sub-regions 118 and coupler sub-regions 119.

With continued reference to FIG. 1, one or more lower intermediary regions 140 may, optionally, be disposed under the magnetic regions (e.g., the fixed region 110 and the free region 120), and one or more upper intermediary regions 150 may, optionally, be disposed over the magnetic regions of the magnetic cell structure 100. The lower intermediary regions 140 and the upper intermediary regions 150, if included, may be configured to inhibit diffusion of species between the lower electrode 105 and overlying materials and between the upper electrode 104 and underlying materials, respectively, during operation of the memory cell. The lower intermediary regions 140 and the upper intermediary regions 150 may, additionally or alternatively, include materials formulated to promote desired crystallization in neighboring materials.

A secondary oxide region 170 is disposed proximate to the MTJ sub-structure 123. For example, the secondary oxide region 170 may be adjacent the free region 120. In some embodiments, the secondary oxide region 170 may directly physically contact the free region 120 along an interface 172. Such secondary oxide region 170 may, thus, be disposed to induce interfacial-MA in the magnetic material of the free region 120. In such embodiments, the magnetic cell structure 100 may be configured with a "dual-oxide" structure.

The free region 120 is also disposed proximate to a getter seed region 180. In some embodiments, the getter seed region 180 may be spaced from the free region 120 by the secondary oxide region 170. In some embodiments, the getter seed region 180 may directly physically contact the secondary oxide region 170 along an interface 178. The getter seed region 180 is formed from a precursor getter seed material comprising at least one getter species. In some embodiments, the precursor getter seed material comprises at least two getter species, at least one of which being formulated to have a chemical affinity for a diffusive species from a neighboring precursor magnetic material and at least another of which being formulated to have a chemical affinity for a diffusive species, such as oxygen, from a neighboring precursor oxide material. In some embodiments, discussed further below with respect to FIGS. 6 through 9, the getter species having a chemical affinity for the diffusive species of the precursor magnetic material may also be included in the secondary oxide region 170. Each getter species may have a higher chemical affinity for its corresponding, targeted diffusive species than the chemical affinity between other species of the corresponding neighboring precursor material and the corresponding, targeted diffusive species.

The initial presence of the diffusive species of the precursor magnetic material may inhibit crystallization of the precursor magnetic material, but the proximity of the getter seed region 180 to the precursor magnetic material may enable diffusion of the diffusive species from the precursor magnetic material to material of the getter seed region 180. Once diffused, the diffused species may chemically react with the getter species, forming a compound that remains in the getter seed region 180 in the final structure.

The removal of the diffusive species from the precursor magnetic material leaves a depleted magnetic material (i.e., a magnetic material with a lower concentration of the diffusive species compared to a concentration before diffusion) that is able to crystallize into a desired crystal structure (e.g., a bcc (001)). The desired crystal structure may be propagated from one or more neighboring materials, e.g., the oxide of the intermediate oxide region 130. The crystallized, depleted magnetic material, having the desired crystal structure, may exhibit high TMR (e.g., greater than about 100% (about 1.00), e.g., greater than about 120% (about 1.20).

The diffusive species of the precursor oxide material may be oxygen (O), and its initial presence in the precursor oxide material contributes to electric resistances and high damping in the oxide material. The proximity of the getter seed region 180 to the precursor oxide material may enable diffusion of the oxygen (O) from the precursor oxide material to the getter seed region 180. Once diffused, the diffused oxygen (O) may chemically react with the other getter species, which may be referred to herein as the "oxygen-getter species," forming an oxide compound that remains in the getter seed region 180 in the final structure.

In some embodiments, the getter seed region 180 may be formulated to be amorphous and remain amorphous while the neighboring depleted magnetic material crystallizes. Thus, the precursor material of the getter seed region 180 may be amorphous when initially formed and may remain amorphous even at high temperatures, e.g., during an anneal, and even once enriched with the diffused species from the precursor magnetic material and the precursor oxide material. Thus, the material of the getter seed region 180 may not inhibit the crystallization of the neighboring depleted magnetic material.

The thickness, composition, and structure of the getter seed region 180 may be selected to provide a sufficient amount of getter species—for the diffusive species from the precursor magnetic material—and a sufficient amount of oxygen-getter species—for the diffusive oxygen (O) from the precursor oxide material—in the getter seed region 180 to have a desired capacity to receive and bond with the diffused species from the neighboring precursor magnetic material and the neighboring precursor oxide material. A thicker getter seed region may have a relatively higher capacity for the diffused species, compared to a thinner getter seed region. According to an embodiment such as that illustrated in FIG. 1, the getter seed region 180 may be between about 7.5 Å (about 0.75 nm) to about 30 Å (about 3.0 nm) in thickness.

The thickness, composition, and structure of the secondary oxide region 170 may be selected to enable diffusion of the diffusive species, from the precursor magnetic material, through the material of the secondary oxide region 170 to the getter seed region 180. For example, the thickness of the secondary oxide region 170 may be tailored to be of a sufficiently high thickness so that interfacial-MA is induced along the interface 172 with the free region 120 while of a sufficiently low thickness so that the diffusive species from the precursor magnetic material may diffuse therethrough and so that enough oxygen can diffuse out of the material of the secondary oxide region 170 to the getter seed region 180, to provide low electrical resistance and low damping. The thickness of the secondary oxide region 170 may, therefore, be less than the thickness of the intermediate oxide region 130 in the MTJ sub-structure 123. According to an embodiment such as that illustrated in FIG. 1, the secondary oxide region 170 may be between about 2 Å (about 0.2 nm) to about 10 Å (about 1.0 nm) in thickness while the thickness of the intermediate oxide region 130 may be between about 5 Å (about 0.5 nm) to about 10 Å (about 1.0 nm).

In some embodiments (not illustrated), additional getter seed regions may be present. For example, another getter seed region may be disposed internal to the secondary oxide region 170 or laterally adjacent to one or both of the secondary oxide region 170 and the free region 120. The additional getter seed regions may also be formulated to receive diffused species from the precursor magnetic material of the free region 120 and formulated to receive oxygen diffused from the precursor oxide material of the secondary oxide region 170.

With continued reference to FIG. 1, in embodiments in which the getter seed region 180 is proximate to the free region 120, the getter seed region 180 may be physically isolated from the fixed region 110 by one or more other regions, e.g., by the free region 120, the intermediate oxide region 130, and the secondary oxide region 170. Therefore, getter species of the getter seed region 180 may not chemically react with species of the fixed region 110.

The magnetic cell structure 100 of FIG. 1 is configured as a "top-pinned" memory cell, i.e., a memory cell in which the fixed region 110 is disposed over the free region 120. In other embodiments (not illustrated), the memory cell may be configured as a "bottom-pinned" memory cell, i.e., a memory cell in which the fixed region 110 is disposed under the free region 120. In such embodiments, the secondary oxide region 170 may overlay the free region 120, and the getter seed region 180 may overlay the secondary oxide region 170. The getter seed region 180 may nonetheless be formulated to receive a species diffused from the precursor magnetic material of the free region 120, to enable propagation of a desired crystal structure from the intermediate oxide region 130 to the depleted magnetic material, and to receive oxygen diffused from the precursor oxide material of the secondary oxide region 170, to enable low electrical resistance and low damping in the secondary oxide region. Thus, any embodiment illustrated or otherwise described herein as being "top-pinned" may be alternatively embodied in a "bottom-pinned" configuration, e.g., by a reversal of the order of the regions of the cell core structure (e.g., the magnetic cell core 101 of FIG. 1).

Figure 1A:
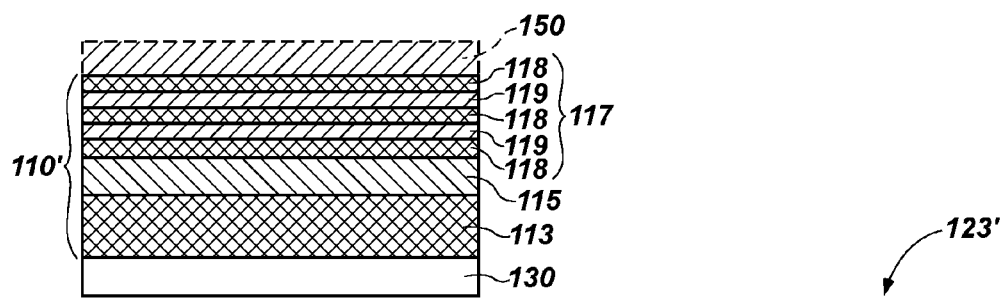
FIG. 1A is an enlarged view of box 1A of FIG. 1, according to an alternate embodiment of the present disclosure, wherein the fixed region includes an oxide-adjacent portion, an intermediate portion, and an electrode-adjacent portion.
Figure 1B:
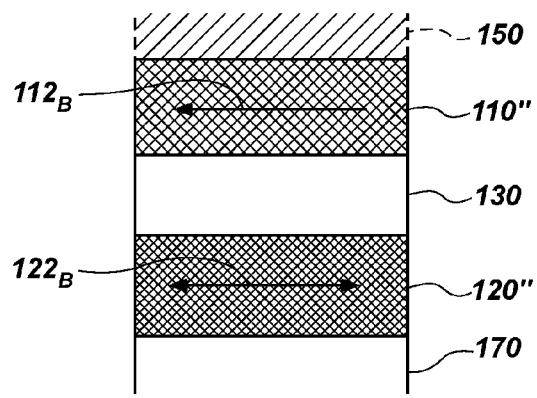
FIG. 1B is a view of box 1B of FIG. 1, according to an alternate embodiment of the present disclosure, wherein the fixed region and the free region exhibit in-plane magnetic orientations.

The memory cells of embodiments of the present disclosure may be configured as out-of-plane STT-MRAM cells, as in FIG. 1, or, alternatively, as in-plane STT-MRAM cells, as illustrated in FIG. 1B. "In-plane" STT-MRAM cells include magnetic regions exhibiting a magnetic orientation that is predominantly oriented in a horizontal direction, while "out-of-plane" STT-MRAM cells include magnetic regions exhibiting a magnetic orientation that is predominantly oriented in a vertical direction. For example, as illustrated in FIG. 1, the STT-MRAM cell may be configured to exhibit a vertical magnetic orientation in at least one of the magnetic regions (e.g., the fixed region 110 and the free region 120). The vertical magnetic orientation exhibited may be characterized by perpendicular magnetic anisotropy ("PMA") strength. As indicated in FIG. 1 by arrows 112 and double-pointed arrows 122, in some embodiments, each of the fixed region 110 and the free region 120 may exhibit a vertical magnetic orientation. The magnetic orientation of the fixed region 110 may remain "substantially fixed," i.e., directed in essentially the same direction throughout operation of the STT-MRAM cell, for example, in the direction indicated by arrows 112 of FIG. 1. The magnetic orientation of the free region 120, on the other hand, may be switched, during operation of the cell, between a parallel configuration and an anti-parallel configuration, as indicated by double-pointed arrows 122 of FIG. 1. As another example, as illustrated in FIG. 1B, an in-plane STT-MRAM cell may be configured to exhibit a horizontal magnetic orientation in at least one of the magnetic regions (e.g., a fixed region 110" and a free region 120") of a MTJ sub-structure 123', as indicated by arrow $112_B$ in the fixed region 110" and double-pointed arrow $122_B$ in the free region 120".

Accordingly, disclosed is a memory cell comprising a magnetic cell core. The magnetic cell core comprises a magnetic tunnel junction sub-structure comprising a fixed region, a free region, and an intermediate oxide region between the fixed region and the free region. A secondary oxide region is adjacent the magnetic tunnel junction sub-structure. A getter seed region is proximate the secondary oxide region and comprises an oxygen-getter species bonded to oxygen. At least one of the secondary oxide region and the getter region comprise another getter species bonded to a diffused species diffused.

Figure 2:
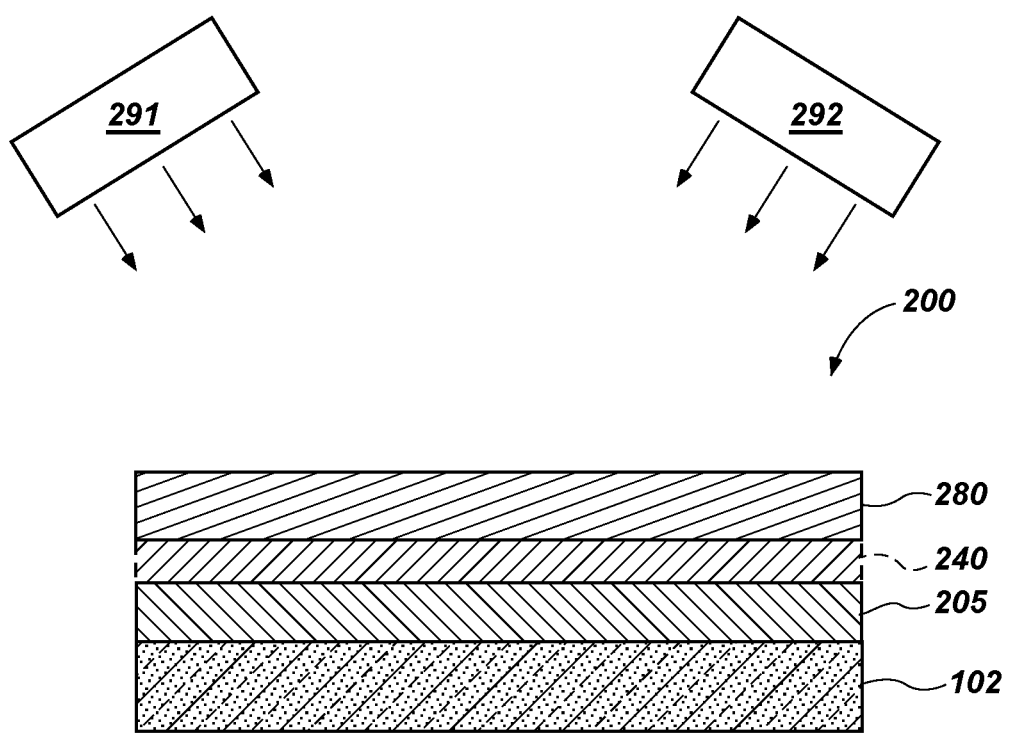

With reference to FIGS. 2 through 5, illustrated are stages in a method of fabricating magnetic cell structures, such as the magnetic cell structure 100 of FIG. 1. As illustrated in FIG. 2, an intermediate structure 200 may be formed with a conductive material 205 formed over the substrate 102, and a precursor getter seed material 280 over the conductive material 205. Optionally, one or more lower intermediary materials 240 may be formed over the conductive material 205, before forming the precursor getter seed material 280 thereover.

The conductive material 205, from which the lower electrode 105 (FIG. 1) is formed, may comprise, consist essentially of, or consist of, for example and without limitation, a metal (e.g., copper, tungsten, titanium, tantalum), a metal alloy, or a combination thereof.

In embodiments in which the optional lower intermediary region 140 (FIG. 1) is formed over the lower electrode 105, the lower intermediary material 240, from which the lower intermediary region 140 is formed, may comprise, consist essentially of, or consist of, for example and without limitation, tantalum (Ta), titanium (Ti), tantalum nitride (TaN), titanium nitride (TiN), ruthenium (Ru), tungsten (W), or a combination thereof. In some embodiments, the lower intermediary material 240, if included, may be incorporated with the conductive material 205 from which the lower electrode 105 (FIG. 1) is to be formed. For example, the lower intermediary material 240 may be an upper-most sub-region of the conductive material 205.

The precursor getter seed material 280 may be formed by, for example and without limitation, sputtering a material comprising at least one getter species over the previously-formed materials. The precursor getter seed material 280 is formulated to include at least one getter species selected to have a chemical affinity for a diffusive species from a precursor magnetic material, from which the free region 120 (FIG. 1) is to be formed. For example, the at least one getter species may be selected to having a higher chemical affinity for the diffusive species of the precursor magnetic material compared to a chemical affinity between the diffusive species and another species of the precursor magnetic material. Therefore, at least one getter species of the precursor getter seed material 280 is formulated to attract the diffusive species from the precursor magnetic material.

The precursor getter seed material 280 is also formulated to include at least another getter species selected to have a chemical affinity for a diffusive species from a precursor oxide material, from which the secondary oxide region 170 (FIG. 1) is to be formed. For example, the at least another getter species may be selected to have a higher chemical affinity for oxygen (O) of the precursor oxide material compared to a chemical affinity between oxygen and another species of the precursor oxide material. Therefore, at least another getter species of the precursor getter seed material 280 is formulated to attract a diffusive species, e.g., oxygen (O), from the precursor oxide material.

In some embodiments, each species of the precursor getter seed material 280 may be formulated to have a chemical affinity for (i.e., be compatible to chemically bond with) at least one of the diffused species from the precursor magnetic material and the diffused species (e.g., oxygen (O)) from the precursor oxide material. In other embodiments, fewer than all of the species of the precursor getter seed material 280 may be formulated to have the desired chemical affinity for the diffusive species. Therefore, the precursor getter seed material 280 may include species non-reactive with one or both of the diffused species or may consist of or consist essentially of species that react with one or both of the diffused species.

With continued reference to FIG. 2, in some embodiments, the precursor getter seed material 280 may be formed by sputtering (i.e., physical vapor deposition (PVD)) using one or more targets 291, 292. For example, and without limitation, two sputter targets 291, 292 may be used simultaneously, with a sputter target 291 formulated to comprise the getter species with a chemical affinity for the diffusive species of the precursor magnetic material and with another sputter target 292 formulated to comprise the getter species (e.g., an oxygen-getter species) with a chemical affinity for the diffusive species (e.g., oxygen (O)) of the precursor oxide material. Both targets 291, 292 may be used simultaneously such that the species intermix and substantially evenly distribute as the precursor getter seed material 280 is formed.

Figure 3:
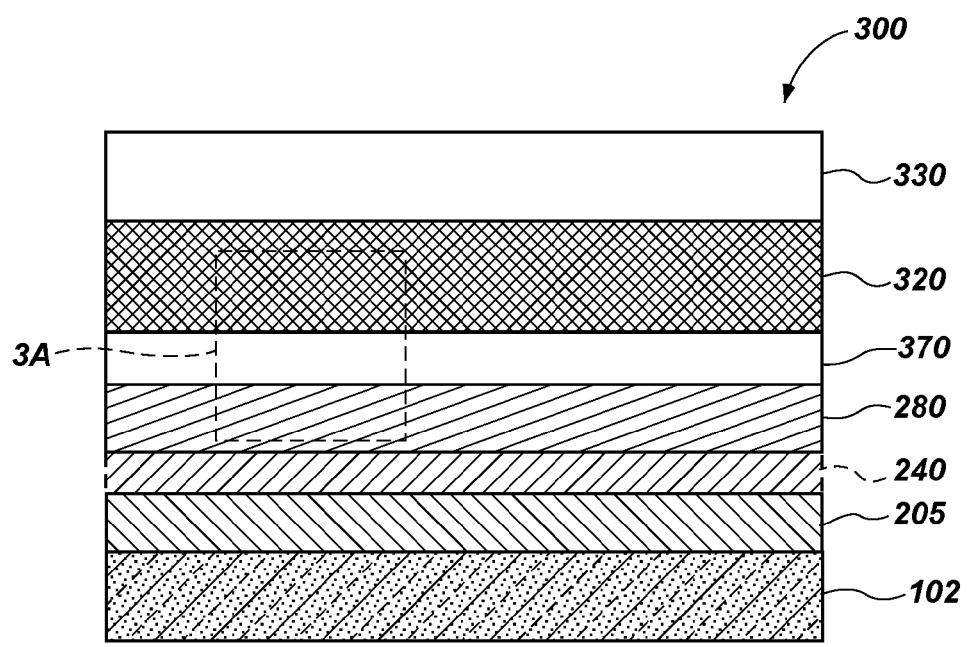

With reference to FIG. 3, a precursor oxide material 370, from which the secondary oxide region 170 (FIG. 1) is to be formed, may comprise, consist essentially of, or consist of, for example and without limitation, a nonmagnetic oxide material (e.g., magnesium oxide (MgO), aluminum oxide ($Al_2O_3$), titanium oxide ($TiO_2$), or other oxide materials of conventional tunnel barrier regions of MTJ sub-structures). The precursor oxide material 370 may be formed (e.g., grown, deposited) directly on the precursor getter seed material 280.

At least one precursor magnetic material 320 may be formed over the precursor getter seed material 280, as also illustrated in FIG. 3. The precursor magnetic material 320, from which the free region 120 (FIG. 1) is eventually formed, may comprise, consist essentially of, or consist of, for example and without limitation, a ferromagnetic material including cobalt (Co) and iron (Fe) (e.g., $Co_xFe_y$, wherein x=10 to 80 and y=10 to 80) and, in some embodiments, also boron (B) (e.g., $Co_xFe_yB_z$, wherein x=10 to 80, y=10 to 80, and z=0 to 50). Thus, the precursor magnetic material 320 may comprise at least one of Co, Fe, and B (e.g., a CoFeB material, a FeB material, a CoB material). In other embodiments, the precursor magnetic material 320 may alternatively or additionally include nickel (Ni) (e.g., an NiB material).

The precursor magnetic material 320 may be formed as a homogeneous region. In other embodiments, the precursor magnetic material 320 may include one or more sub-regions, e.g., of CoFeB material, with the sub-regions having different relative atomic ratios of Co, Fe, and B.

Figure 3A:
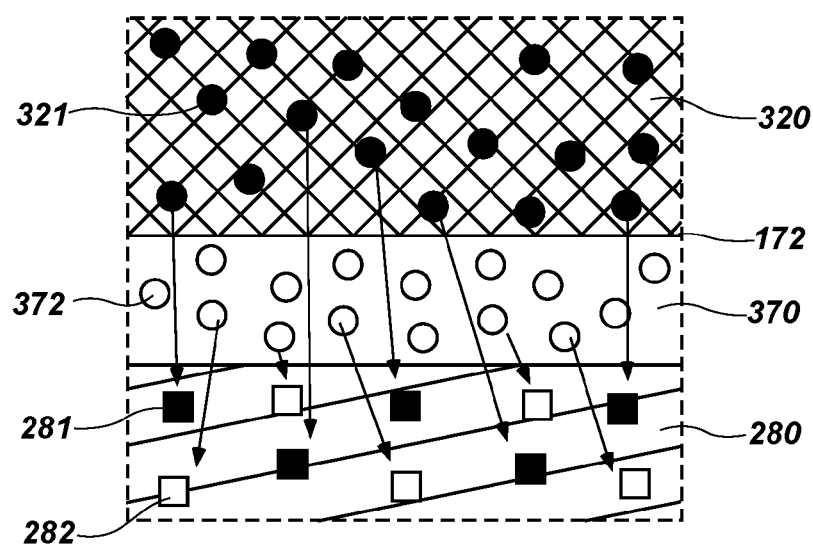
FIG. 3A is an enlarged view of box 3A of FIG. 3.

With reference to FIG. 3A, the precursor magnetic material 320 includes at least one diffusive species 321. The diffusive species 321 is such that its absence, in whole or in part, would not inhibit the precursor magnetic material 320, or a depleted magnetic material formed therefrom, from exhibiting magnetism. However, the presence of the diffusive species 321 in the precursor magnetic material 320 may enable the precursor magnetic material 320 to be formed (e.g., by sputtering) in an amorphous state.

Also with reference to FIG. 3A, the precursor oxide material 370 includes at least one diffusive species 372. The diffusive species 372 is such that its absence, from the body of the precursor oxide material 370, will not inhibit the precursor oxide material 370, or a depleted oxide material formed therefrom, from inducing interfacial-MA with the precursor magnetic material 320 or the depleted magnetic material. Rather, the presence of the diffusive species 372 along only the interface 172 between the precursor oxide material 370 (or resulting depleted oxide material) and the precursor magnetic material 320 (or resulting depleted magnetic material) may enable the inducement of interfacial-MA.

The precursor getter seed material 280 may be formulated to include at least two getter species, including a getter species 281 and another getter species 282. The getter species 281 is formulated to have a chemical affinity for the diffusive species 321 of the precursor magnetic material 320, and the another getter species 282 is formulated to have a chemical affinity for the diffusive species 372 of the precursor oxide material 370.

The getter species 281 of the precursor getter seed material 280 may be selected to have an endothermic heat of formation of a compound between the getter species 281 and the diffusive species 321 from the precursor magnetic material 320. Moreover, the getter species 281 may be selected to be electrically conductive (e.g., may comprise a conductive metal), so as to increase the conductivity of the getter seed region 180 (FIG. 1) of the final structure. Finally, the getter species 281 may be selected to be substantially non-reactive with the another getter species 282 and to enable the precursor getter seed material 280 to exhibit an amorphous structure at up to high temperatures (e.g., at least about 500° C.).

In some embodiments, the precursor getter seed material 280 may include, as the getter species 281 having a chemical affinity for the diffusive species 321 of the precursor magnetic material 320, at least one of tantalum (Ta), ruthenium (Ru), tungsten (W), aluminum (Al), titanium (Ti), zirconium (Zr), nitrogen (N), hafnium (Hf), and nickel (Ni).

In one particular example, without limitation, the precursor magnetic material 320 may be a CoFeB magnetic material, the boron (B) thereof being the diffusive species 321. The precursor getter seed material 280 (and, for example, the target 291 (FIG. 2)) may be formulated to comprise, consist essentially of, or consist of tungsten-ruthenium-nitrogen (W—Ru—N) with an atomic ratio of about 49.5:49.5:1.0. Such a composition is formulated to exhibit an amorphous structure up to high temperatures (e.g., up to about 500° C.). Each of the tungsten (W), ruthenium (Ru), and nitrogen (N) may be the getter species 281 exhibiting a chemical affinity for the boron (B) diffusive species 321.

In other embodiments, the precursor getter seed material 280 (and, for example, the target 291 (FIG. 2)) may be formulated to comprise, consist essentially of, or consist of: tungsten-nitrogen (W—N) with an atomic ratio of about 75:25, wherein both the tungsten (W) and the nitrogen (N) may be the getter species 281 exhibiting a chemical affinity for the boron (B) diffusive species 321; tungsten-ruthenium-boron (W—Ru—B) with an atomic ratio of about 46:37:17, wherein the tungsten (W) and the ruthenium (Ru) may be the getter species 281 exhibiting a chemical affinity for the boron (B); tungsten-ruthenium (W—Ru) with an atomic ratio of about 45:55, wherein the tungsten (W) and the ruthenium (Ru) may be the getter species 281 exhibiting a chemical affinity for the boron (B); and iron-cobalt-tungsten (Fe—Co—W) with an atomic ratio for FeCo to W of about less than 82 to greater than 18, wherein the tungsten (W) may be the getter species 281 exhibiting a chemical affinity for the boron (B).

In any of the embodiments in which nitrogen (N) is included in the precursor getter seed material 280, the presence of nitrogen (N) in the material also enables low damping, and thus lower programming currents, in the resulting cell structure.

The another getter species 282 of the precursor getter seed material 280 may be selected to have a heat of formation, of a compound between the another getter species 282 and the another diffusive species 372 from the precursor oxide material 270, that is less than or about equal to the heat of formation of a compound between the another diffusive species 372 and another species of the precursor oxide material 270. For example, and without limitation, in embodiments in which the secondary oxide material 370 is formulated to consist essentially of magnesium oxide (MgO), the another getter species 282 may be selected to have a lower heat of formation with oxygen (O), being the another diffusive species 372, compared to a heat of formation between oxygen (O) and the magnesium (Mg) of the MgO.

In some embodiments, the precursor getter seed material 280 may include, as the another getter species 282, at least one of calcium (Ca), strontium (Sr), beryllium (Be), lanthanum (La), barium (Ba), aluminum (Al), and magnesium (Mg).

An oxide material 330, from which the intermediate oxide region 130 (FIG. 1) is formed, may be formed on the precursor magnetic material 320, e.g., before an anneal during which the precursor magnetic material 320 (or, rather, a depleted magnetic material formed from the precursor magnetic material 320) is crystallized through propagation of a crystal structure from the oxide material 330. The oxide material 330 may comprise, consist essentially of, or consist of, for example and without limitation, a nonmagnetic oxide material (e.g., magnesium oxide (MgO), aluminum oxide ($Al_2O_3$), titanium oxide ($TiO_2$), or other oxide materials of conventional MTJ nonmagnetic regions). The another oxide material 330 may be the same material as the precursor oxide material 370 or a material comprising the same elements as the precursor oxide material 370 though with different atomic ratios thereof. For example, and without limitation, both of the oxide material 330 and precursor another oxide material 370 may comprise, consist essentially of, or consist of MgO.

The oxide material 330 may be formed (e.g., grown, deposited) directly on the precursor magnetic material 320. The oxide material 330 may be crystalline (e.g., with the bcc (001) structure) when initially formed or may be later crystallized during anneal. The oxide material 330 may be positioned such that, during anneal of, e.g., an intermediate structure 300 of FIG. 3, the desired crystal structure may propagate to a neighboring magnetic material (e.g., a depleted magnetic material 420 (FIG. 4)) to enable the magnetic material (e.g., the depleted magnetic material 420 (FIG. 4)) to crystallize into the same crystal structure (e.g., the bcc (001) structure).

Figure 4:
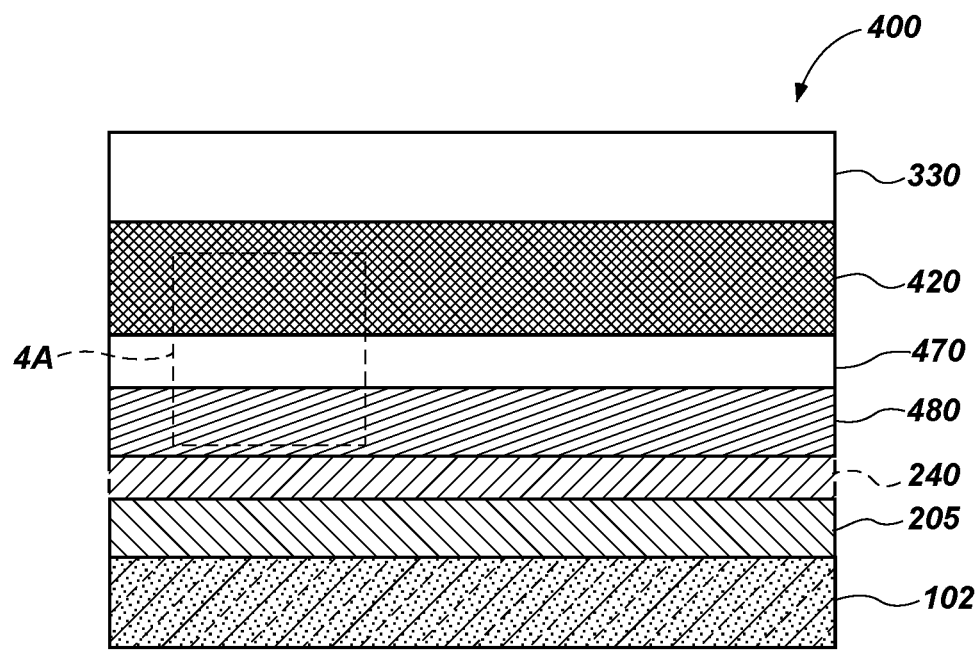
Figure 4A:
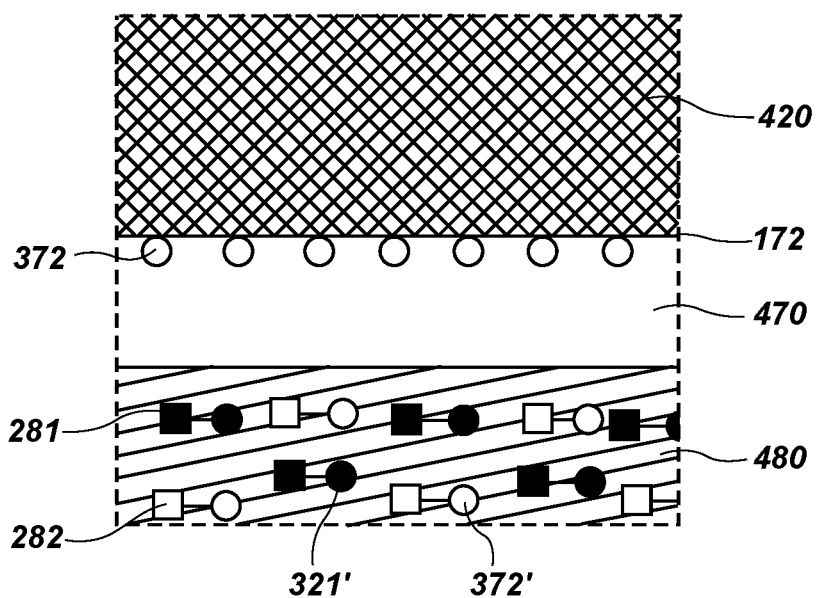
FIG. 4A is an enlarged view of box 4A of FIG. 4.

During subsequent processing, such as during the anneal that crystallizes the magnetic material (e.g., the depleted magnetic material 420 (FIG. 4)), or during an additional subsequent anneal, of the intermediate structure 300 of FIG. 3, the diffusive species 321 may transfer (e.g., diffuse) from the precursor magnetic material 320, through the precursor oxide material 370, to the precursor getter seed material 280. Likewise, during the anneal, the another diffusive species 372 may transfer (e.g., diffuse) from the precursor oxide material 370 to the precursor getter seed material 280. As this occurs, as illustrated in FIGS. 4 and 4A, the getter species 281 may react with and bond to the diffusive species 321 (now referred to, herein, as a diffused species 321'), and the another getter species 282 may react with and bond to the another diffusive species 372 (now referred to, herein, as another diffused species 372'). Thus, the precursor magnetic material 320 (FIG. 3) is converted to a "depleted" magnetic material 420, the precursor oxide material 370 (FIG. 3) is converted to a "depleted" oxide material 470, and the precursor getter seed material 280 (FIG. 3) is converted to an "enriched" getter seed material 480.

At least in an embodiment in which the another diffusive species 372 of the precursor oxide material 370 (FIG. 3) is oxygen (O), the depleted oxide material 470 may not be completely devoid of the another diffusive species 372. Rather, an amount of the oxygen (O) may remain proximate the interface 172 with the depleted magnetic material 420. Thus, any oxygen remaining in the depleted oxide material 470 may include a maximum oxygen concentration along the interface 172. Therefore, oxygen (O) at the interface 172 may function to bond with, e.g., iron (Fe) in the depleted magnetic material 420 to induce interfacial-MA along the interface 172. Nonetheless, the decreased concentration of oxygen (O) throughout the remainder of the depleted oxide material 470 may reduce the electrical resistance of the depleted oxide material 470. In some embodiments, the reduction, but not complete depletion, of oxygen may enable the depleted oxide material 470 to be electrically conductive. Thus, the resulting magnetic cell structure may include dual oxide regions (i.e., the intermediate oxide region 130 and the secondary oxide region 170 (FIG. 1), formed from the depleted oxide material 470) without degrading the electrical resistance (i.e., without substantially raising the electrical resistance) of the memory cell.

With continued reference to FIG. 4A, the enriched getter seed material 480 includes the diffused species 321', the another diffused species 372', the getter species 281, and the another getter species 282. Therefore, in an embodiment in which the precursor magnetic material 320 (FIG. 3) was formulated as a CoFeB material and the precursor oxide material 370 (FIG. 3) was formulated to include magnesium oxide (MgO), the enriched getter seed material 480 may include the boron (B) (as the diffused species 321') from the CoFeB material, and a portion of the oxygen (O) (as the another diffused species 372') from the MgO, leaving some of oxygen (O) (as the diffusive species 372) along the interface 172 with the CoFe depleted magnetic material 420.

Accordingly, disclosed is a memory cell comprising a magnetic region comprising cobalt (Co) and iron (Fe). The magnetic region exhibits a switchable magnetic orientation. An oxide region is disposed between the magnetic region and another magnetic region exhibiting a substantially fixed magnetic orientation. Another oxide region is adjacent the magnetic region and comprises oxygen concentrated proximate an interface with the magnetic region. An amorphous getter seed region is adjacent the another oxide region. The getter seed region comprises oxygen, boron, an oxygen-getter species, and a boron-getter species.

In some embodiments, the precursor getter seed material 280 (FIG. 3) may be formulated to be amorphous when initially formed over the substrate 102 and to remain amorphous when converted to the enriched getter seed material 480. Thus, the atomic ratios of the getter species 281, 282 in the precursor getter seed material 280 (FIG. 3) may be selected to tailor the atomic ratios in the final, enriched getter seed material 480 to a composition that will be amorphous and remain amorphous at high anneal temperatures.

Moreover, the precursor getter seed material 280 (FIG. 3) may be formulated such that the precursor getter seed material 280 is stable (e.g., species will not out-diffuse) at high temperatures used during anneal for crystallizing the depleted magnetic material 420. Therefore, the high temperatures that promote crystallization of the depleted magnetic material 420 (e.g., by crystal structure propagation from the oxide material 330) to a desired crystal structure (e.g., a bcc (001) structure) may be utilized without the precursor getter seed material 280 inhibiting the crystallization. Without being limited to any one theory, it is contemplated that the amorphous nature of the enriched getter seed material 480 avoids microstructure defects in the depleted magnetic material 420 that may otherwise form if the enriched getter seed material 480 had a microstructure that differed from and competed with that of the desired crystal structure (e.g., the bcc (001) structure) as the crystal structure propagated to the depleted magnetic material 420 from a neighboring material (e.g., oxide material 330 (FIG. 3) for the intermediate oxide region 130 (FIG. 1)). Further, because the depleted magnetic material 420 may be formed to exhibit the desired crystal structure, due to lack of interference, by the depleted oxide material 470, with the crystal structure propagation between the oxide material 330 of the intermediate oxide region 130 (FIG. 1) to the depleted magnetic material 420, the free region 120 (FIG. 1) may be formed to exhibit a crystal structure that promotes high TMR.

For example, in an embodiment in which the precursor magnetic material 320 (FIG. 3) was formulated to be a CoFeB material, it is contemplated that removing the diffusive species 321 (FIG. 3A) of boron (B) from the CoFeB precursor magnetic material 320 with a precursor getter seed material 280 having the getter species 281 having a chemical affinity for the boron (B) may enable crystallization of the depleted magnetic material 420 at a lower temperature than the crystallization temperature of the CoFeB (i.e., the precursor magnetic material 320 (FIG. 3) still including the diffusive species 321). Thus, an anneal temperature used (e.g., up to about 500° C., or more) may enable crystallization of the depleted magnetic material 420 (e.g., by propagating the desired crystal structure from a neighboring material, e.g., the oxide material 330 of the intermediate oxide region 130 (FIG. 1)) without being so high as to degrade neighboring materials (e.g., without out-diffusing a species, e.g., tungsten (W), from the enriched getter seed material 480). The depleted magnetic material 420 may, therefore, be crystallized into a desired crystal structure (e.g., a bcc (001) crystal structure) that enables formation of a magnetic cell structure (e.g., the magnetic cell structure 100 (FIG. 1)) without suffering from substantial structural defects. The absence of substantial structural defects may enable a high TMR.

Other materials of the intermediate structure 300 (FIG. 3) may also be crystallized due to annealing to form an annealed structure 400 (FIG. 4). The annealing process may be conducted at an annealing temperature of from about 300° C. to about 700° C. (e.g., about 500° C.) and may be held at the annealing temperature for from about one minute (about 1 min.) to about one hour (about 1 hr.). The annealing temperature and time may be tailored based on the materials of the intermediate structure 300, the desired crystal structure of, e.g., the depleted magnetic material 420, a desired amount of depletion of the diffused species 321' from the precursor magnetic material 320 (FIG. 3), and a desired amount of depletion of the another diffused species 372' from the precursor oxide material 370 (FIG. 3).

While the removal of the diffusive species 321 (FIG. 3A) from the precursor magnetic material 320 (FIG. 3) may promote crystallization of the depleted magnetic material 420, it is further contemplated, without being limited to any particular theory, that removal may also promote inducement of MA along the interface 172 between the depleted magnetic material 420 and the depleted oxide material 470, along the interface 132 (FIG. 1) between the depleted magnetic material 420 and the intermediate oxide region 130 (FIG. 1), or along both interfaces 172, 132. For example, in the absence of the diffusive species 321 (FIG. 3A), the other species of the depleted magnetic material 420 may have more interaction with the oxide material than the other species would have if the diffusive species 321 were still incorporated in the precursor magnetic material 320. Moreover, the retention of the diffused species 321' (FIG. 4A), via chemical bonds with the getter species 281, in the enriched getter seed material 480 may avoid the diffused species 321' diffusing to the interfaces 172, 132 (FIG. 1) between the magnetic region (e.g., the free region 120) and its neighboring MA-inducing oxide regions. This may enable more MA-inducing interaction along the interfaces 172, 132 (FIG. 1) than may otherwise be achieved. Therefore, the MA strength may be greater, due to the presence of the precursor getter seed material 280 (or, rather, the enriched getter seed material 480) than the MA strength of the same structure without the precursor getter seed material 280 (or, rather, the enriched getter seed material 480).

For example, in embodiments in which the precursor magnetic material 320 is a CoFeB material, with the boron (B) being the diffusive species 321, the diffusion of boron (B) diffusive species 321 from the precursor magnetic material 320 may inhibit the boron (B) diffusive species 321 from lingering along the interface 172, where it may otherwise interfere with the inducement of interfacial MA. It is contemplated that, with a substantial amount of boron (B) along the interface 172, the presence of the boron (B) may inhibit formation of bonds between the magnetic material (e.g., the depleted magnetic material 420 (FIG. 4)) and the oxide material (e.g., the depleted oxide material 470 (FIG. 4)), such as iron-oxygen (Fe—O) bonds that induce MA. Thus, the proximity of the getter species 281, in the precursor getter seed material 380, to the precursor magnetic material 320, may enable higher interfacial-MA inducement because the diffusive species 321 may be directed to the precursor getter seed material 380 and away from the interface 172.

While the free region 120 (FIG. 1) is described as being "formed from" the precursor magnetic material 320 (e.g., a CoFeB material) that comprises the diffusive species 321 (FIG. 3A), the free region 120 of the fabricated, magnetic cell core 101 (FIG. 1) (or any cell core of the present disclosure) may comprise substantially less of the diffusive species 321 (e.g., the boron (B)) than when the precursor magnetic material 320 was initially formed. Likewise, while the secondary oxide region 170 (FIG. 1) is described as being "formed from" the precursor oxide material 320 (FIG. 3) (e.g., an MgO-including material) that comprises the another diffusive species 372 (e.g., oxygen (O)), the secondary oxide region 170 of the fabricated, magnetic cell core 101 (FIG. 1) (or any cell core of the present disclosure) may comprise substantially less of the another diffusive species 372 (e.g., the oxygen (O)) than when the precursor oxide material 370 was initially formed.

Figure 5:
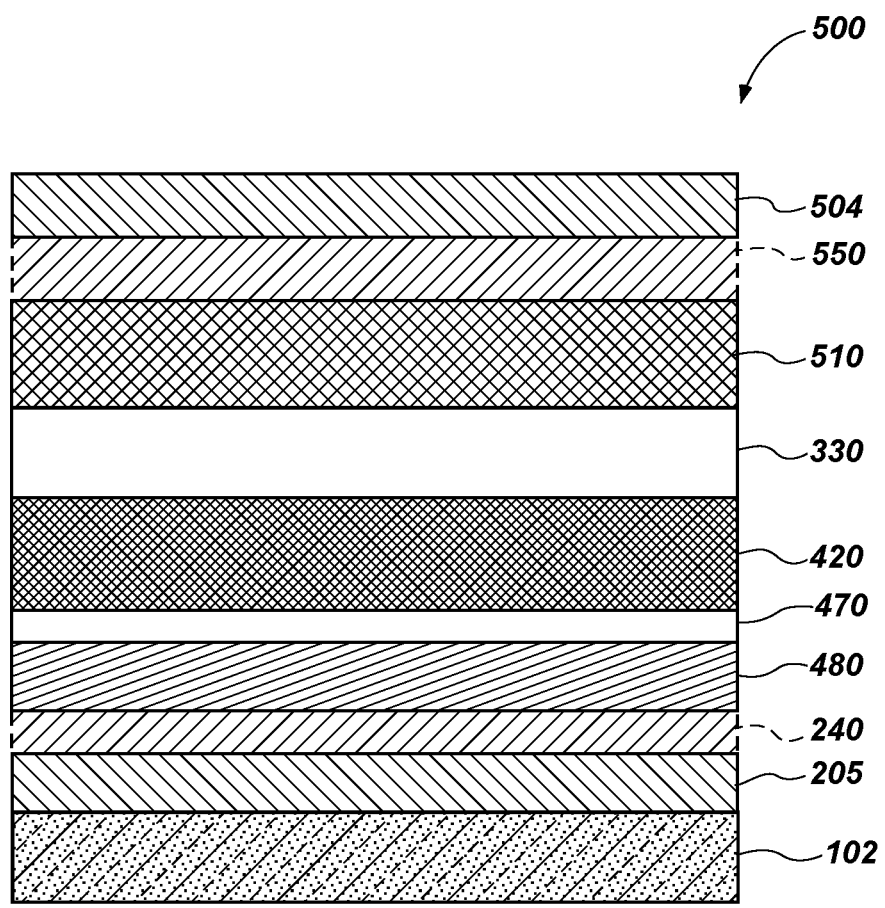

After the anneal, the other materials of the magnetic cell structure may be formed over the annealed intermediate structure 400, to form a precursor structure 500 as illustrated in FIG. 5. In other embodiments, the other materials of the magnetic cell structure 100 (FIG. 1) may be formed over, e.g., the oxide material 330, e.g., before the anneal, and may be annealed along with the lower materials.

With continued reference to FIG. 5, another magnetic material 510, from which the fixed region 110 (FIG. 1) is to be formed, may be formed (e.g., grown, deposited) directly on the oxide material 330, e.g., before or after the anneal stage that crystallizes the depleted magnetic material 420. The another magnetic material 510 may comprise, consist essentially of, or consist of, for example and without limitation, ferromagnetic material including cobalt (Co) and iron (Fe) (e.g., $Co_xFe_y$, wherein x=10 to 80 and y=10 to 80) and, in some embodiments, also boron (B) (e.g., $Co_xFe_yB_z$, wherein x=10 to 80, y=10 to 80, and z=0 to 50). Thus, the another magnetic material 510 may comprise a CoFeB material. In some embodiments, the another magnetic material 510 may include the same material as the precursor magnetic material 320 (FIG. 3), or a material having the same elements, though in different atomic ratios.

In embodiments in which the fixed region 110 (FIG. 1) is configured to have the structure of the fixed region 110' of FIG. 1A, an intermediate material, for the intermediate portion 115 (FIG. 1A), may be formed over the another magnetic material 510. The intermediate material may comprise, consist essentially of, or consist of a conductive material (e.g., tantalum (Ta)). Alternating magnetic material and coupler material, for the magnetic sub-regions 118 (FIG. 1A) and coupler sub-regions 119 (FIG. 1A), respectively, may be formed on the intermediate material. For example, and without limitation, the alternating magnetic and coupler materials may comprise, consist essentially of, or consist of cobalt/palladium (Co/Pd) multi-sub-regions; cobalt/platinum (Co/Pt) multi-sub-regions; cobalt/nickel (Co/Ni) multi-sub-regions; cobalt/iridium (Co/Ir) multi-sub-regions; cobalt/iron/terbium (Co/Fe/Tb) based materials, $L_1 0$ materials, coupler materials, or other magnetic materials of conventional fixed regions.

In some embodiments, optionally, one or more upper intermediary materials 550 may be formed over the another magnetic material 510 (and any other materials from which the fixed region 110 (FIG. 1) is to be formed). The upper intermediary materials 550, which, if included, form the optional upper intermediary regions 150 (FIG. 1), may comprise, consist essentially of, or consist of materials configured to ensure a desired crystal structure in neighboring materials. The upper intermediary materials 550 may alternatively or additionally include metal materials configured to aid in patterning processes during fabrication of the magnetic cell, barrier materials, or other materials of conventional STT-MRAM cell core structures. In some embodiments, the upper intermediary material 550 may include a conductive material (e.g., one or more materials such as copper, tantalum, titanium, tungsten, ruthenium, hafnium, zirconium, tantalum nitride, or titanium nitride) to be formed into a conductive capping region.

Another conductive material 504, from which the upper electrode 104 (FIG. 1) may be formed, may be formed over the another magnetic material 510 (and any other materials from which the fixed region 110 (FIG. 1) is to be formed) and, if present, the upper intermediary materials 550. In some embodiments, the another conductive material 504 and the upper intermediary materials 550, if present, may be integrated with one another, e.g., with the upper intermediary materials 550 being lower sub-regions of the conductive material 504.

The precursor structure 500 may then be patterned, in one or more stages, to form the magnetic cell structure 100, according to the embodiment illustrated in FIG. 1. Techniques for patterning structures such as the precursor structure 500 to form structures such as the magnetic cell structure 100 (FIG. 1) are known in the art and so are not described herein in detail.

After patterning the precursor structure 500, the magnetic cell structure 100 includes the magnetic cell core 101 including the secondary oxide region 170 and the getter seed region 180 proximate to the free region 120. The free region 120 includes the depleted magnetic material 420 (FIG. 4), formed from the precursor magnetic material 320 (FIG. 3) and comprises a lower concentration of the diffusive species 321 (FIG. 3A) than a free region formed from the precursor magnetic material 320 (FIG. 3) without the getter seed region 180 proximate thereto. The secondary oxide region 170 includes the depleted oxide material 470 (FIG. 4), formed from the precursor oxide material 370 (FIG. 3) and comprises a lower concentration of the another diffusive species 372 (FIG. 3A) than a secondary oxide region formed from the precursor oxide material 370 (FIG. 3) without the getter seed region 180 proximate thereto.

In some embodiments, the magnetic region (e.g., the free region 120) proximate to the getter seed region 180 may be substantially or completely depleted of the diffusive species 321. In other embodiments, the magnetic region may be partially depleted of the diffusive species 321. In such embodiments, the magnetic region or regions may have a gradient of the diffusive species 321 (e.g., boron) therethrough, with a low concentration of the diffusive species 321 adjacent to the getter seed region 180, along interface 172 (FIG. 1), and a high concentration of the diffusive species 321 opposite the getter seed region 180, along interface 132 (FIG. 1), relative to one another. The concentration of the diffusive species 321 may, in some embodiments, equilibrate after or during anneal.

The free region 120, formed with a crystalline, depleted magnetic material 420 (FIG. 4), may have a desired crystal structure that may be substantially free of defects, due, at least in part, to the removal of the diffusive species 321 and the bonding of the diffused species 321 to the getter species 281 and due, at least in part, to the amorphous microstructure of the getter seed region 180.

The crystallinity of the free region 120 may enable the magnetic cell structure 100 to exhibit a high TMR during use and operation. Furthermore, the depleted magnetic material 420 of the free region 120 may promote MA-inducement with neighboring oxide regions (e.g., the secondary oxide region 170 and the intermediate oxide region 130).

The secondary oxide region 170, formed with the depleted oxide material 470 (FIG. 4), may have low electrical resistance, e.g., may be electrically conductive, with a maximum oxygen concentration along the interface 172 with the free region 120.

Thus, high MA strength may be promoted due to MA-inducement in the free region 120 from both of the dual oxide regions (i.e., the intermediate oxide region 130 and the secondary oxide region 170) without also exhibiting high electrical resistance (e.g., high resistance area (RA)) and high damping. In embodiments in which the getter seed region 180 includes nitrogen (N), low damping may be even further enabled.

Accordingly, disclosed is a method of forming a memory cell, the method comprising forming a precursor structure. Forming a precursor structure comprises forming a precursor getter seed material over a substrate. A precursor oxide material is formed over the precursor getter seed material. A precursor magnetic material is formed over the precursor oxide material. A diffusive species is diffused from the precursor magnetic material, and oxygen is diffused from the precursor oxide material, to the precursor getter seed material to convert at least a portion of the precursor magnetic material into a depleted magnetic material, to convert at least a portion of the precursor oxide material into an oxygen-depleted material, and to convert at least a portion of the precursor getter seed material into an enriched getter seed material. The precursor structure is patterned to form a cell core structure comprising a getter seed region formed from the enriched getter seed material, a secondary oxide region formed from the oxygen-depleted material, and a free region formed from the depleted magnetic material.

Figure 6:
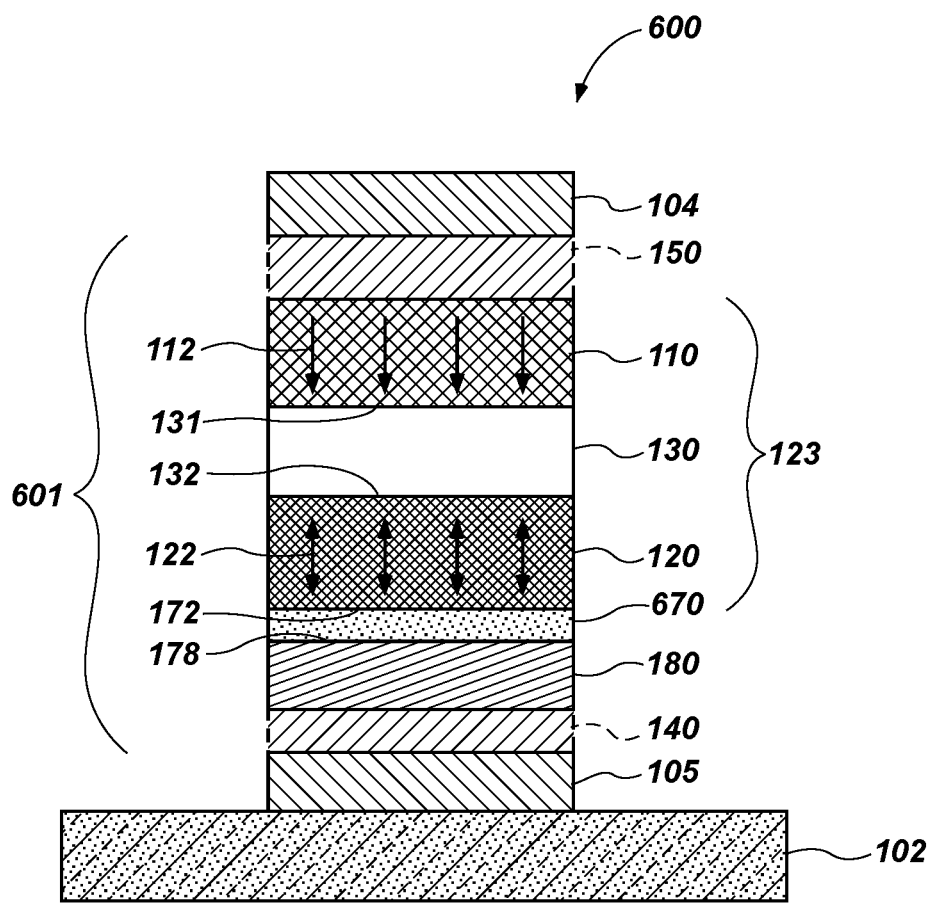
FIG. 6 is a cross-sectional, elevational, schematic illustration of a magnetic cell structure according to another embodiment of the present disclosure, wherein a getter seed region is adjacent to a getter secondary oxide region.
Figure 7:
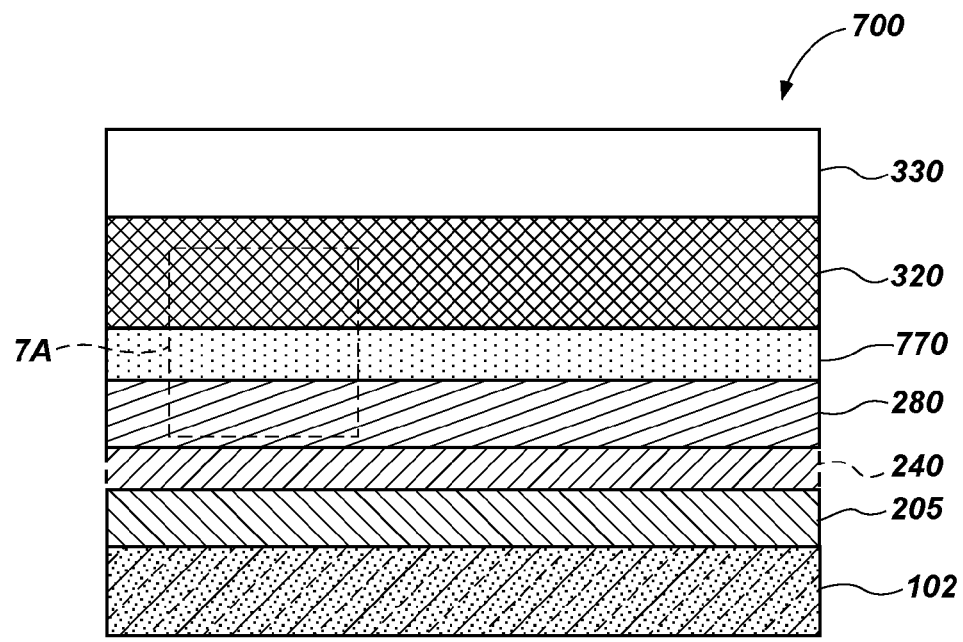

With reference to FIG. 6, illustrated is a magnetic cell structure 600 according to another embodiment of the present disclosure. The magnetic cell structure 600 includes a magnetic cell core 601 comprising a getter secondary oxide region 670. The getter secondary oxide region 670 may be formed from a precursor getter oxide material 770, as illustrated in FIG. 7, that includes the same material as the precursor oxide material 370 (FIG. 3) described above, while also including additional getter species 281', formulated to have a chemical affinity for the diffusive species 321 of the precursor magnetic material 320. For example, in one embodiment, the precursor getter oxide material 770 may include magnesium oxide (MgO) with the additional getter species 281' added. The precursor getter oxide material 770 may be disposed, within an intermediate structure 700, between the precursor getter seed material 280 and the precursor magnetic material 320.

Figure 7A:
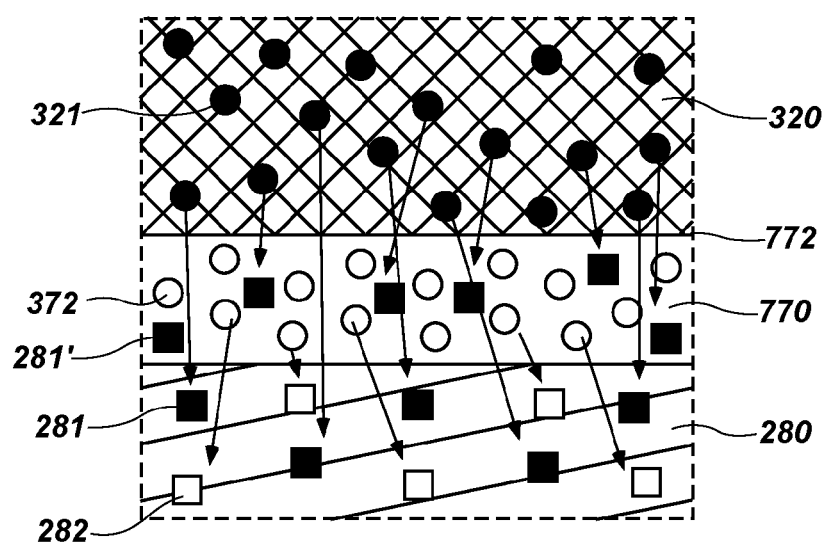
FIG. 7A is an enlarged view of box 7A of FIG. 7.
Figure 8:
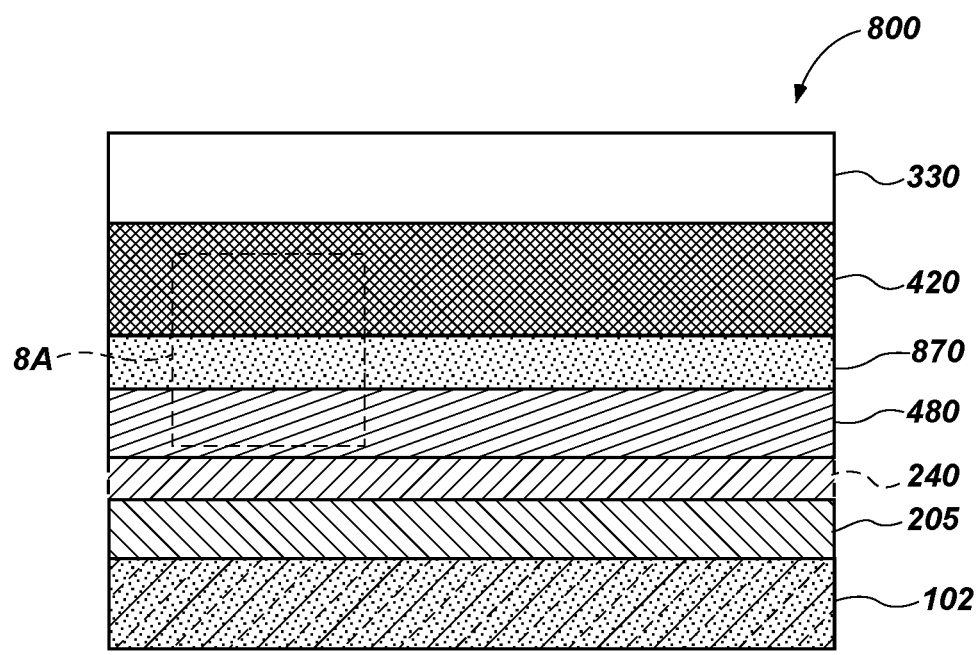
Figure 8A:
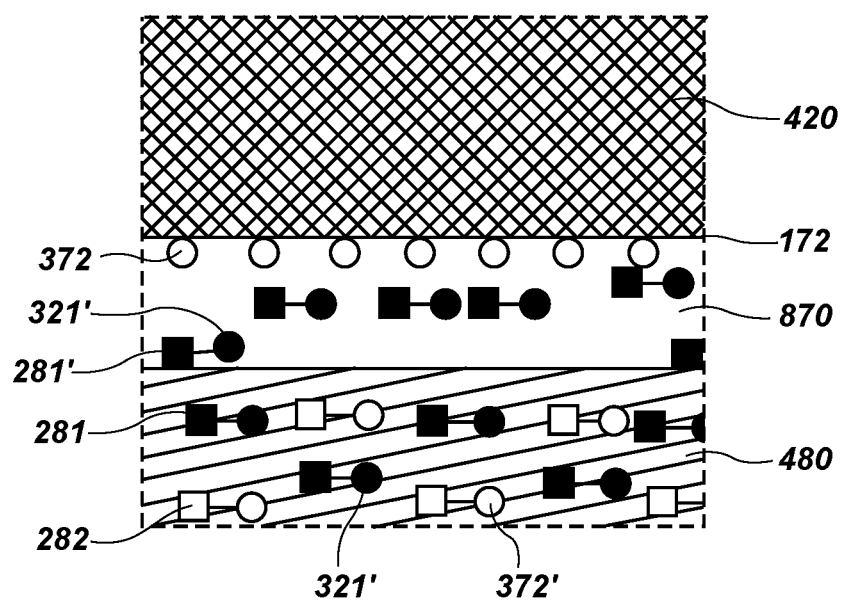
FIG. 8A is an enlarged view of box 8A of FIG. 8.

As illustrated in FIG. 7A, the diffusive species 321 (e.g., boron (B)) may be attracted not only to the getter species 281 in the precursor getter seed material 280, but also to the additional getter species 281' in the precursor getter oxide material 770. Following anneal, therefore, an annealed structure 800, as illustrated in FIGS. 8 and 8A, includes an "enriched-depleted" oxide material 870, formed from the precursor getter oxide material 770. The enriched-depleted oxide material 870 is both enriched with some amount of the diffused species 321', bonded to the additional getter species 281', and depleted of the another diffusive species 372 (e.g., oxygen (O)), except along the interface 172.

The additional getter species 281' may be the same as, or different than, the getter species 281 in the enriched getter seed material 480. Thus, the additional getter species 281' may be selected from any of the species described above with respect to the getter species 281.

Figure 9:
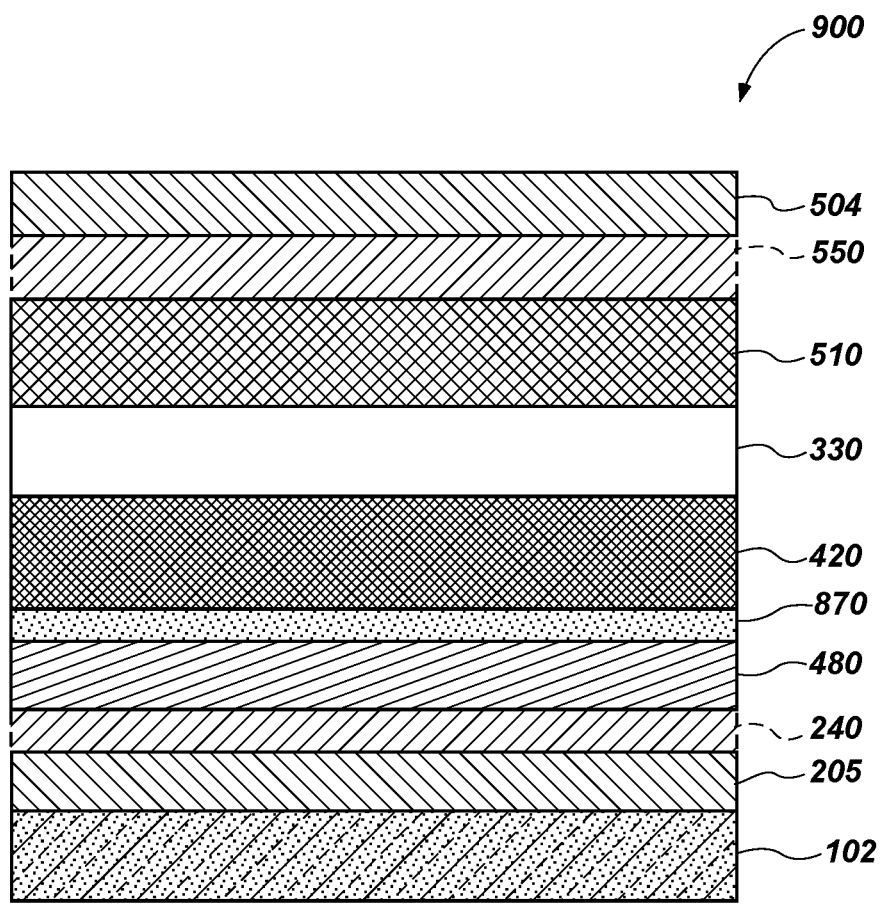

To form the precursor oxide material 770 (FIG. 7), the additional getter species 281' may be implanted into the precursor oxide material 370 (FIG. 3), before formation of the precursor magnetic material 320. For example, without limitation, the additional getter species 281' may be incorporated into the precursor oxide material 370 (FIG. 3) by co-sputtering of both the additional getter species 281' and the precursor oxide material 370 using physical vapor deposition (PVD). As another example, without limitation, the additional getter species 281' may be introduced in the form of a gas during deposition of the precursor oxide material 370. The remaining materials of a precursor structure 900 may then be formed, as illustrated in FIG. 9, and the precursor structure 900 patterned to form the magnetic cell structure 600 of FIG. 6.

In this or the aforementioned embodiments of this disclosure, in which the secondary oxide region 170 (FIG. 1) or the getter secondary oxide region 670 (FIG. 6) is formulated to comprise magnesium oxide (MgO), the combined composition of the precursor getter seed material 280 and the precursor oxide material 370 (FIG. 3) or the precursor getter oxide material 770 (FIG. 7) may be such that an atomic ratio of the magnesium (Mg) to the oxygen (O) to the getter species 281 (e.g., boron-getter species), including the additional getter species 281' (if using the precursor getter oxide material 770), to the another getter species 282 (e.g., oxygen-getter species) (i.e., the Mg:O:B-getter:O-getter atomic ratio) may be from about 40:40:10:10 to about 45:45:5:5. Therefore, one or more of the getter species 281, including the additional getter species 281' (if included) and the another getter species 282 may be at low atomic levels (e.g., "dopant" levels of less than about 10 at. %, e.g., less than about 5 at. %, e.g., less than about 2 at. %).

Accordingly, disclosed is a method of forming a semiconductor structure. The method comprises forming an amorphous precursor getter seed material over a substrate. The amorphous precursor getter seed material comprises a boron-getter species and an oxygen-getter species. A precursor oxide material, comprising oxygen, is formed over the amorphous precursor getter seed material. A precursor magnetic material, comprising boron, is formed over the precursor oxide material. Another oxide material is formed over the precursor magnetic material. At least the precursor magnetic material and the precursor oxide material are annealed to react the boron from the precursor magnetic material with the boron-getter species of the amorphous precursor getter seed material and to react the oxygen from the precursor oxide material with the oxygen-getter species of the amorphous precursor getter seed material.

Figure 10:
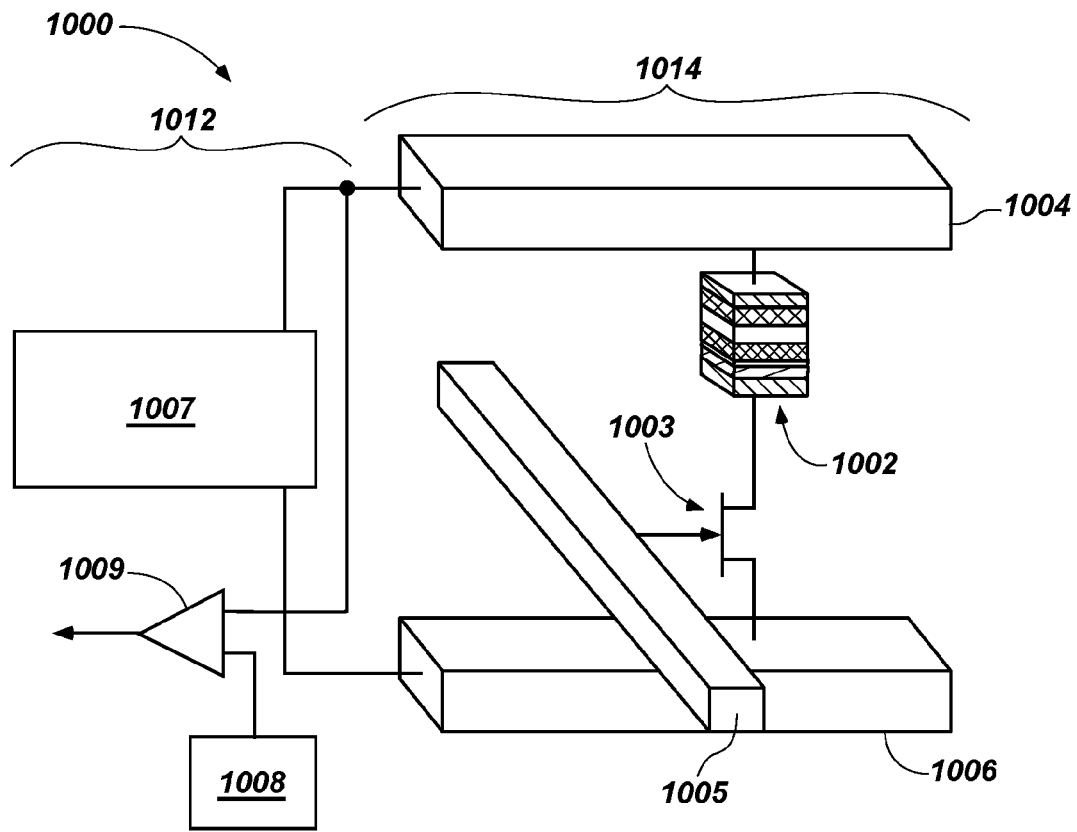
FIG. 10 is a schematic diagram of an STT-MRAM system including a memory cell having a magnetic cell structure according to an embodiment of the present disclosure.

With reference to FIG. 10, illustrated is an STT-MRAM system 1000 that includes peripheral devices 1012 in operable communication with an STT-MRAM cell 1014, a grouping of which may be fabricated to form an array of memory cells in a grid pattern including a number of rows and columns, or in various other arrangements, depending on the system requirements and fabrication technology. The STT-MRAM cell 1014 includes a magnetic cell core 1002, an access transistor 1003, a conductive material that may function as a data/sense line 1004 (e.g., a bit line), a conductive material that may function as an access line 1005 (e.g., a word line), and a conductive material that may function as a source line 1006. The peripheral devices 1012 of the STT-MRAM system 1000 may include read/write circuitry 1007, a bit line reference 1008, and a sense amplifier 1009. The cell core 1002 may be any one of the magnetic cell cores (e.g., the magnetic cell cores 101 (FIG. 1), 601 (FIG. 6)) described above. Due to the structure of the cell core 1002, the method of fabrication, or both, the STT-MRAM cell 1014 may have high MA strength, low resistance (e.g., low resistance-area (RA) product), low damping, and high TMR.

In use and operation, when an STT-MRAM cell 1014 is selected to be programmed, a programming current is applied to the STT-MRAM cell 1014, and the current is spin-polarized by the fixed region of the cell core 1002 and exerts a torque on the free region of the cell core 1002, which switches the magnetization of the free region to "write to" or "program" the STT-MRAM cell 1014. In a read operation of the STT-MRAM cell 1014, a current is used to detect the resistance state of the cell core 1002.

To initiate programming of the STT-MRAM cell 1014, the read/write circuitry 1007 may generate a write current (i.e., a programming current) to the data/sense line 1004 and the source line 1006. The polarity of the voltage between the data/sense line 1004 and the source line 1006 determines the switch in magnetic orientation of the free region in the cell core 1002. By changing the magnetic orientation of the free region with the spin polarity, the free region is magnetized according to the spin polarity of the programming current, the programmed logic state is written to the STT-MRAM cell 1014.

To read the STT-MRAM cell 1014, the read/write circuitry 1007 generates a read voltage to the data/sense line 1004 and the source line 1006 through the cell core 1002 and the access transistor 1003. The programmed state of the STT-MRAM cell 1014 relates to the electrical resistance across the cell core 1002, which may be determined by the voltage difference between the data/sense line 1004 and the source line 1006. In some embodiments, the voltage difference may be compared to the bit line reference 1008 and amplified by the sense amplifier 1009.

FIG. 10 illustrates one example of an operable STT-MRAM system 1000. It is contemplated, however, that the magnetic cell cores 101 (FIG. 1), 601 (FIG. 6) may be incorporated and utilized within any STT-MRAM system configured to incorporate a magnetic cell core having magnetic regions.

Accordingly, disclosed is a semiconductor device comprising a spin torque transfer magnetic random memory (STT-MRAM) array comprising STT-MRAM cells. At least one STT-MRAM cell of the STT-MRAM cells comprises a magnetic tunnel junction sub-structure over a substrate. The magnetic tunnel junction sub-structure comprises a free region, a fixed region, and an intermediate oxide region. The free region exhibits a vertical, switchable magnetic orientation. The fixed region exhibits a vertical, substantially fixed magnetic orientation. The intermediate oxide region is between the free region and the fixed region. Another oxide region contacts the free region. An amorphous region is proximate the free region and the another oxide region. The amorphous region comprises boron and oxygen.

Figure 11:
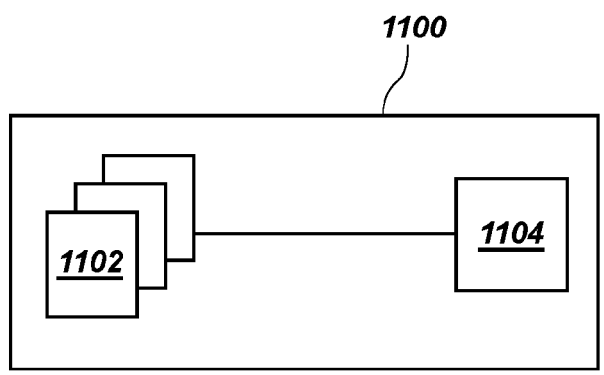
FIG. 11 is a simplified block diagram of a semiconductor device structure including memory cells having a magnetic cell structure according to an embodiment of the present disclosure.

With reference to FIG. 11, illustrated is a simplified block diagram of a semiconductor device 1100 implemented according to one or more embodiments described herein. The semiconductor device 1100 includes a memory array 1102 and a control logic component 1104. The memory array 1102 may include a plurality of the STT-MRAM cells 1014 (FIG. 10) including any of the magnetic cell cores (e.g., the magnetic cell cores 101 (FIG. 1), 601 (FIG. 6)) discussed above, which magnetic cell cores (e.g., the magnetic cell cores 101 (FIG. 1), 601 (FIG. 6)) may have been formed according to a method described above and may be operated according to a method described above. The control logic component 1104 may be configured to operatively interact with the memory array 1102 so as to read from or write to any or all memory cells (e.g., STT-MRAM cell 1014 (FIG. 10)) within the memory array 1102.

Figure 12:
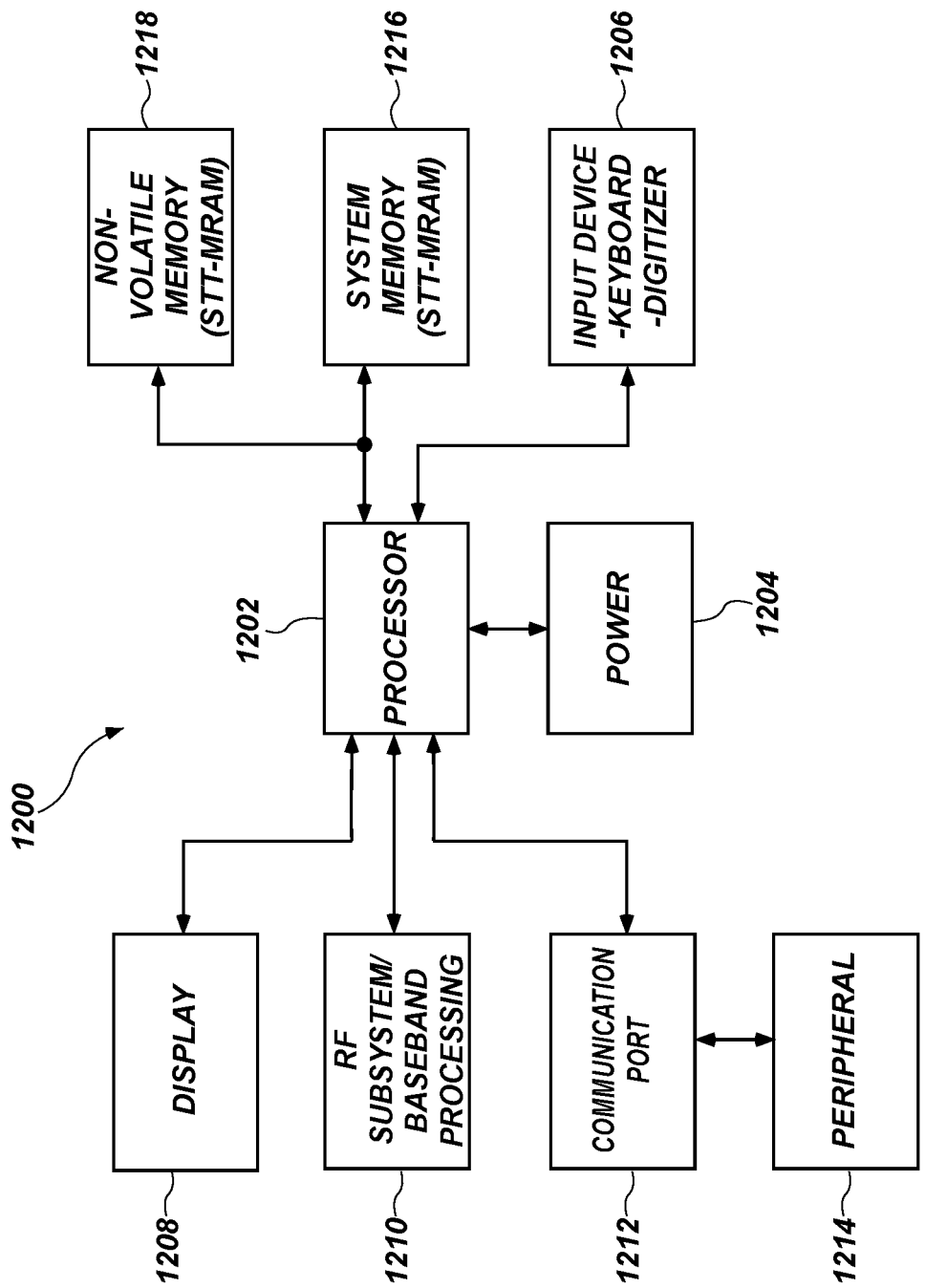
FIG. 12 is a simplified block diagram of a system implemented according to one or more embodiments of the present disclosure.

With reference to FIG. 12, depicted is a processor-based system 1200. The processor-based system 1200 may include various electronic devices manufactured in accordance with embodiments of the present disclosure. The processor-based system 1200 may be any of a variety of types such as a computer, pager, cellular phone, personal organizer, control circuit, or other electronic device. The processor-based system 1200 may include one or more processors 1202, such as a microprocessor, to control the processing of system functions and requests in the processor-based system 1200. The processor 1202 and other subcomponents of the processor-based system 1200 may include magnetic memory devices manufactured in accordance with embodiments of the present disclosure.

The processor-based system 1200 may include a power supply 1204 in operable communication with the processor 1202. For example, if the processor-based system 1200 is a portable system, the power supply 1204 may include one or more of a fuel cell, a power scavenging device, permanent batteries, replaceable batteries, and rechargeable batteries. The power supply 1204 may also include an AC adapter; therefore, the processor-based system 1200 may be plugged into a wall outlet, for example. The power supply 1204 may also include a DC adapter such that the processor-based system 1200 may be plugged into a vehicle cigarette lighter or a vehicle power port, for example.

Various other devices may be coupled to the processor 1202 depending on the functions that the processor-based system 1200 performs. For example, a user interface 1206 may be coupled to the processor 1202. The user interface 1206 may include input devices such as buttons, switches, a keyboard, a light pen, a mouse, a digitizer and stylus, a touch screen, a voice recognition system, a microphone, or a combination thereof. A display 1208 may also be coupled to the processor 1202. The display 1208 may include an LCD display, an SED display, a CRT display, a DLP display, a plasma display, an OLED display, an LED display, a three-dimensional projection, an audio display, or a combination thereof. Furthermore, an RF sub-system/baseband processor 1210 may also be coupled to the processor 1202. The RF sub-system/baseband processor 1210 may include an antenna that is coupled to an RF receiver and to an RF transmitter (not shown). A communication port 1212, or more than one communication port 1212, may also be coupled to the processor 1202. The communication port 1212 may be adapted to be coupled to one or more peripheral devices 1214, such as a modem, a printer, a computer, a scanner, or a camera, or to a network, such as a local area network, remote area network, intranet, or the Internet, for example.

The processor 1202 may control the processor-based system 1200 by implementing software programs stored in the memory. The software programs may include an operating system, database software, drafting software, word processing software, media editing software, or media playing software, for example. The memory is operably coupled to the processor 1202 to store and facilitate execution of various programs. For example, the processor 1202 may be coupled to system memory 1216, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 1216 may include volatile memory, non-volatile memory, or a combination thereof. The system memory 1216 is typically large so that it can store dynamically loaded applications and data. In some embodiments, the system memory 1216 may include semiconductor devices, such as the semiconductor device 1100 of FIG. 11, memory cells including any of the magnetic cell cores 101 (FIG. 1), 601 (FIG. 6) described above, or a combination thereof.

The processor 1202 may also be coupled to non-volatile memory 1218, which is not to suggest that system memory 1216 is necessarily volatile. The non-volatile memory 1218 may include one or more of STT-MRAM, MRAM, read-only memory (ROM) such as an EPROM, resistive read-only memory (RROM), and flash memory to be used in conjunction with the system memory 1216. The size of the non-volatile memory 1218 is typically selected to be just large enough to store any necessary operating system, application programs, and fixed data. Additionally, the non-volatile memory 1218 may include a high capacity memory such as disk drive memory, such as a hybrid-drive including resistive memory or other types of non-volatile solid-state memory, for example. The non-volatile memory 1218 may include semiconductor devices, such as the semiconductor device 1100 of FIG. 11, memory cells including any of the magnetic cell cores 101 (FIG. 1), 601 (FIG. 6) described above, or a combination thereof.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A magnetic device, comprising:
a structure extending vertically from a substrate, the structure comprising:
a magnetic region between nonmagnetic oxide regions, the magnetic region exhibiting a switchable magnetic orientation; and
an amorphous getter region proximate one of the nonmagnetic oxide regions, the amorphous getter region comprising:
a first getter species bonded to a species diffused from the one of the nonmagnetic oxide regions; and
a second getter species bonded to a species diffused from the magnetic region.

2. The magnetic device of claim 1, further comprising another magnetic region exhibiting a fixed magnetic orientation, the another magnetic region spaced from the one of the nonmagnetic oxide regions.

3. The magnetic device of claim 1, wherein:
the species diffused from the one of the nonmagnetic oxide regions comprises oxygen; and
the species diffused from the magnetic region comprises boron.

4. The magnetic device of claim 1, wherein the amorphous getter region defines a thickness between about 7.5 Angstroms (about 0.75 nm) and about 30Angstroms (about 3.0 nm).

5. The magnetic device of claim 1, wherein the switchable magnetic orientation exhibited by the magnetic region is a vertical switchable magnetic orientation.

6. The magnetic device of claim 1, wherein the second getter species is nonreactive with the first getter species.

7. The magnetic device of claim 1, wherein the amorphous getter region is not in physical contact with the magnetic region of the structure.

8. The magnetic device of claim 1, wherein:
the magnetic region is above the one of the nonmagnetic oxide regions; and
the amorphous getter region is below the one of the nonmagnetic oxide regions.

9. A magnetic device, comprising:
a magnetic tunnel junction sub-structure comprising:
a free region exhibiting a switchable magnetic orientation; and
a fixed region exhibiting a fixed magnetic orientation;
an oxide region adjacent the free region; and
a getter region in physical contact with the oxide region and comprising:
an oxygen-getter species bonded to oxygen diffused from the oxide region; and
at least one other getter species bonded to a species diffused from the free region,
wherein the getter region is spaced from the magnetic tunnel junction sub-structure by the oxide region.

10. The magnetic device of claim 9, wherein:
the oxide region is external to the magnetic tunnel junction sub-structure; and
the magnetic tunnel junction sub-structure further comprises a nonmagnetic oxide region between the free region and the fixed region.

11. The magnetic device of claim 9, wherein the oxide region comprises another getter species bonded to the species diffused from the free region.

12. The magnetic device of claim 11, wherein:
the species diffused from the free region comprises boron;
the getter region comprises the at least one other getter species bonded to the boron; and
the oxide region comprises the another getter species bonded to the boron.

13. The magnetic device of claim 11, wherein the another getter species of the oxide region comprises at least one of tantalum (Ta), ruthenium (Ru), tungsten (W), aluminum (Al), titanium (Ti), zirconium (Zr), nitrogen (N), hafnium (Hf), or nickel (Ni).

14. The magnetic device of claim 9, wherein the at least one other getter species comprises tungsten (W) and at least one of nitrogen (N) or ruthenium (Ru).

15. The magnetic device of claim 9, wherein the oxygen-getter species comprises at least one of calcium (Ca), strontium (Sr), beryllium (Be), lanthanum (La), barium (Ba), aluminum (Al), or magnesium (Mg).

16. A method of forming a magnetic device, the method comprising:
forming a precursor structure on a substrate, comprising:
forming a precursor getter material over the substrate, the precursor getter material comprising a first getter species and a second getter species;
forming a precursor oxide material over the precursor getter material;

forming a precursor magnetic material over the precursor oxide material; and forming another oxide material over the precursor magnetic material;

annealing at least a portion of the precursor structure to diffuse a species from the precursor oxide material to bond with the first getter species and to diffuse a species from the precursor magnetic material to bond with the second getter species; and patterning the precursor structure to form at least one structure of the magnetic device, the at least one structure comprising a magnetic region formed from the precursor magnetic material and exhibiting a switchable magnetic orientation.

17. The method of claim 16, wherein forming a precursor getter material comprises, simultaneously:

sputtering from a sputter target comprising the first getter species; and sputtering from another sputter target comprising the second getter species.

18. The method of claim 16, wherein the annealing comprises diffusing the species from the precursor magnetic material through the precursor oxide material to bond with the second getter species of the precursor getter material.

19. The method of claim 16, wherein:

forming a precursor oxide material over the precursor getter material comprises forming an oxide material comprising a third getter species; and annealing at least a portion of the precursor structure comprises:

diffusing a portion of the species from the precursor magnetic material to bond with the second getter species of the precursor getter material; and diffusing another portion of the species from the precursor magnetic material to bond with the third getter species of the precursor oxide material.

* * * * *

UNITED STATES PATENT AND TRADEMARK OFFICE
CERTIFICATE OF CORRECTION

PATENT NO. : 10,347,689 B2
APPLICATION NO. : 15/660417
DATED : July 9, 2019
INVENTOR(S) : Gurtej S. Sandhu and Sumeet C. Pandey Page 1 of 1

It is certified that error appears in the above-identified patent and that said Letters Patent is hereby corrected as shown below:

In the Specification
Column 5, Line 20, change "silicon-on-insulator ("SOT")" to --silicon-on-insulator ("SOI")--

Signed and Sealed this
Third Day of September, 2019

Andrei Iancu
*Director of the United States Patent and Trademark Office*